(12) United States Patent
Chu et al.

(10) Patent No.: US 10,941,034 B1
(45) Date of Patent: Mar. 9, 2021

(54) PARTICLE FILTER FOR MEMS DEVICE

(71) Applicant: Taiwan Semiconductor Manufacturing Co., Ltd., Hsin-Chu (TW)

(72) Inventors: Chia-Hua Chu, Zhubei (TW); Chun-Wen Cheng, Zhubei (TW); Wen Cheng Kuo, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/542,479

(22) Filed: Aug. 16, 2019

(51) Int. Cl.
    *B81C 1/00*    (2006.01)
    *B81B 7/00*    (2006.01)

(52) U.S. Cl.
    CPC ........ *B81C 1/00158* (2013.01); *B81B 7/0061* (2013.01); *B81C 1/0023* (2013.01); *B81C 1/00325* (2013.01); *B81B 2201/0257* (2013.01)

(58) Field of Classification Search
    CPC .............. B81C 1/00158; B81C 1/0023; B81C 1/00325; B81B 7/0061; B81B 2201/0257
    See application file for complete search history.

(56) References Cited

U.S. PATENT DOCUMENTS

| | | | |
|---|---|---|---|
| 8,447,057 B2 | 5/2013 | Goida et al. | |
| 9,078,063 B2 | 7/2015 | Loeppert | |
| 10,609,463 B2 | 3/2020 | Cheng et al. | |
| 2012/0237073 A1 | 7/2012 | Goida | |
| 2013/0058509 A1 | 3/2013 | Mietta et al. | |
| 2015/0060955 A1 | 3/2015 | Chen | |
| 2015/0294896 A1 | 10/2015 | Hurwitz et al. | |
| 2018/0220216 A1* | 8/2018 | Agashe | G02B 5/26 |
| 2018/0362332 A1 | 12/2018 | Khenkin | |
| 2020/0169818 A1* | 5/2020 | Rombach | B81B 7/0061 |

FOREIGN PATENT DOCUMENTS

| CN | 105448648 A | 3/2016 |
|---|---|---|
| WO | WO2018223389 | * 12/2018 |

OTHER PUBLICATIONS

U.S. Appl. No. 16/542,489, filed Aug. 16, 2019.
Non Final Office Action dated Jun. 17, 2020 in connection with U.S. Appl. No. 16/542,489.

* cited by examiner

*Primary Examiner* — Matthew L Reames
(74) *Attorney, Agent, or Firm* — Eschweiler & Potashnik, LLC

(57) ABSTRACT

Various embodiments of the present disclosure are directed towards a microphone including a particle filter disposed between a microelectromechanical systems (MEMS) substrate and a carrier substrate. A MEMS device structure overlies the MEMS substrate. The MEMS device structure includes a diaphragm having opposing sidewalls that define a diaphragm opening. The carrier substrate underlies the MEMS substrate. The carrier substrate has opposing sidewalls that define a carrier substrate opening underlying the diaphragm opening. A filter stack is sandwiched between the carrier substrate and the MEMS substrate. The filter stack includes an upper dielectric layer, a lower dielectric layer, and a particle filter layer disposed between the upper and lower dielectric layers. The particle filter layer includes the particle filter spaced laterally between the opposing sidewalls of the carrier substrate.

20 Claims, 17 Drawing Sheets

PARTICLE FILTER FOR MEMS DEVICE

BACKGROUND

Microelectromechanical systems (MEMS) devices, such as accelerometers, pressure sensors, and microphones, have found widespread use in many modern day electronic devices. MEMS devices may have a movable part, which is used to detect a motion, and convert the motion to electrical signal. For example, MEMS accelerometers and microphones are commonly found in automobiles (e.g., in airbag deployment systems), tablet computers, or in smart phones. A MEMS accelerometer includes a movable part that transfer the accelerating movement to an electrical signal. A microphone includes a movable membrane that transfer the sound to an electrical signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
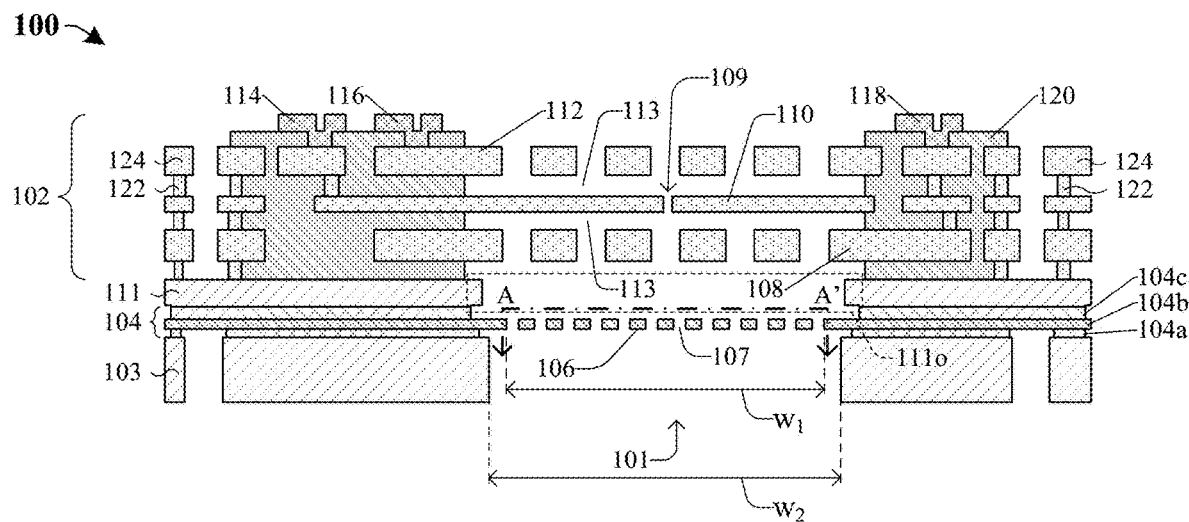
FIG. 1 illustrates a cross-sectional view of some embodiments of a microelectromechanical systems (MEMS) microphone with a particle filter.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Microelectromechanical system (MEMS) devices used for acoustical applications (e.g., MEMs microphones) are often housed within a package structure that has an opening (i.e., an inlet). The package structure is configured to provide protection of a MEMS device while the opening allows for sound waves to reach a cavity of the package structure holding the MEMS device. Within such a package, a MEMS device may be electrically coupled to an application-specific integrated circuit (ASIC) disposed within the cavity of the package structure. The MEMS device has movable parts directly overlying the opening of the package structure, and a particle filter is disposed between the movable parts and the opening of the package structure. The particle filter is configured to prevent particles from entering the opening of the package structure, thereby mitigating particles that reach the movable parts. Particles interacting with the movable parts may decreases performance of the MEMS device, by causing short circuits and/or decreasing an acoustic overload point (AOP) of the MEMS device.

One approach to fabricate a particle filter for a MEMS device is to form the particle filter separate from fabricating the MEMS device and the ASIC. For example, the MEMS device may be fabricated with moveable elements, and the ASIC may be fabricated with semiconductor devices (e.g., transistors). A package substrate may be provided to integrate the MEMS device and ASIC. A package structure opening may be formed in the package substrate, and subsequently, a particle filter may be formed over the package structure opening. After forming the particle filter, the MEMS device is directly attached to the particle filter. Thus, the moveable elements of the MEMS device directly overlie the package structure opening. In some embodiments, the particle filter may be directly attached to the MEMS device before attaching the MEMS device to the substrate. The direct attachment process may include utilizing alignment marks formed on the MEMS device and/or the particle filter, and/or performing a bonding process.

A problem with the aforementioned approaches is the extra processing steps utilized to form the particle filter and directly attach the particle filter to the MEMS device. This, in part, increases time and costs associated with integrating the MEMS device and the ASIC on the package substrate. Further, during the direct attachment process, a small thickness (e.g., less than 0.5 micrometers) of the particle filter may result in damage and/or destruction of the particle filter, thereby reducing an ability of the particle filter to protect the moveable elements from particles. Furthermore, by virtue of the extra processing steps utilized to from and attach the particle filter, the particle filter and MEMS device are exposed to more particles, thus decreasing performance of the moveable elements. In addition, the particle filter comprises a plurality of particle filter openings and, due to processing limitations, a diameter of the particle filter openings may each be substantially large (e.g., about 10 micrometers or greater). This in turn may mitigate an ability to block and/or prevent particles from passing through the particle filter openings.

The present disclosure, in some embodiments, relates to a method that simplifies the fabrication of a MEMS device with a particle filter. The method forms the particle filter and MEMS device as an integrated structure prior to attaching the particle filter and MEMS device to a package structure. By forming the particle filter and MEMS device as an integrated structure, the fabrication process is simplified and damage to the particle filter is reduced. Furthermore, time and costs associated with forming the particle filter are reduced.

As an example application, the MEMS device can be a microphone. In some embodiments, the microphone is fabricated by providing a carrier substrate and forming a filter stack over the carrier substrate. The filter stack includes an upper dielectric layer, a lower dielectric layer, and a particle filter layer disposed between the upper and lower dielectric layers. The filter stack is patterned, thereby defining a particle filter in the particle filter layer. A MEMS substrate is bonded to the upper dielectric layer. A MEMS device structure is formed over the MEMS substrate. After forming the MEMS device structure, the carrier substrate and the MEMS substrate are patterned to form openings in the carrier and MEMs substrates. The MEMS device structure and the filter stack are patterned to form one or more moveable elements in the MEMS device structure and to remove the upper and lower dielectric layers from the particle filter. By forming the particle filter on the carrier substrate, the carrier substrate, the upper dielectric layer, and the lower dielectric layer provide structural support for the particle filter during fabrication of the microphone thereby reducing damage to the particle filter. Furthermore, by removing the upper and lower dielectric layers from the particle filter during the last patterning process, an exposure to particles is reduced, thereby increasing performance of the particle filter and the moveable elements.

Referring to FIG. 1, a cross-sectional view of some embodiments of a microelectromechanical systems (MEMS) microphone 100 with a particle filter 106 is provided.

The MEMS microphone 100 includes a MEMS device structure 102, a MEMS substrate 111, a filter stack 104, and a carrier substrate 103. The filter stack 104 is disposed between the carrier substrate 103 and the MEMS substrate 111. The MEMS device structure 102 includes conductive wires 124 and conductive vias 122 disposed within an inter-level dielectric (ILD) structure 120 overlying the MEMS substrate 111. The MEMS device structure 102 further includes a first back plate 108, a second back plate 112, and a diaphragm 110 disposed between the first and second back plates 108, 112. The diaphragm 110 is spaced apart from the first back plate 108 and the second back plate 112 by one or more non-zero distances. Further, the diaphragm 110 and the first and second back plates 108, 112 can be electrically conductive, which forms a capacitive element. An electrical contact 114 is electrically coupled to the diaphragm 110 and forms a first terminal for the capacitive element, an electrical contact 118 is electrically coupled to the first back plate 108 and forms a second terminal for the capacitive element, and an electrical contact 116 is electrically coupled to the second back plate 112 and forms a third terminal for the capacitive element. In some embodiments, the second terminal and the third terminal are electrically coupled together. In some embodiments, the electrical coupling is achieved through the conductive wires 124 and the conductive vias 122.

The diaphragm 110 includes one or more diaphragm openings 109 and may be anchored by the ILD structure 120 at multiple points. Anchoring the diaphragm 110 at the multiple points allows a boundary of the diaphragm 110 to be fixed relative to the first and second back plates 108, 112. The diaphragm 110 is deformable by energy of sound waves to make the diaphragm 110 bend towards or away from the first back plate 108 and/or the second back plate 112, as the sound waves exert pressure on the diaphragm 110 through a carrier substrate opening 101 in the carrier substrate 103. The carrier substrate 103 has sidewalls defining the carrier substrate opening 101 and the MEMS substrate 111 has sidewalls defining a MEMS opening 111o. In some embodiments, a first width $w_1$ extending between sidewalls defining outermost openings of the particle filter 106 is less than a second width $w_2$ of the sidewalls of the carrier substrate 103 defining the carrier substrate opening 101. The first and second back plates 108, 112 each comprise a plurality of openings by which air may pass through. There is an air volume space 113 between the first and second back plates 108, 112. The air volume space 113 is above and below the diaphragm 110. Air can get out of or get into the air volume space 113 through air passage ways formed by the plurality of openings in each of the first and second back plates 108, 112, and/or through the one or more diaphragm openings 109 of the diaphragm 110. The air travels out of or into the air volume space 113 as the diaphragm 110 bends towards or away from the first back plate 108 and/or the second back plate 112. The bending movement of the diaphragm 110 relative to the first back plate 108 and/or the second back plate 112 by the sound waves changes the capacitance of the capacitive element between the diaphragm 110 and the first and/or second back plates 108, 112. Such change of the capacitance can be measured with the electrical contacts 114, 116, 118.

As the air travels through the carrier substrate opening 101 in the carrier substrate 103 to the air volume space 113, it passes through the particle filter 106. In some embodiments, the particle filter 106 is a part of the filter stack 104. The filter stack 104 comprises a lower dielectric layer 104a, a particle filter layer 104b, and an upper dielectric layer 104c. In some embodiments, the lower dielectric layer 104a may comprise an oxide (e.g., silicon dioxide), the particle filter layer 104b may comprise a nitride (e.g., silicon nitride), and the upper dielectric layer 104c may comprise an oxide (e.g., silicon dioxide). The particle filter 106 is a segment of the particle filter layer 104b between the carrier substrate opening 101 and MEMS opening 111o. The particle filter 106 comprises a plurality of filter openings 107 configured to pass air from the carrier substrate opening 101 to the air volume space 113. As the air passes from the carrier substrate opening 101 to the air volume space 113, the particle filter 106 is configured to block and/or remove particles from the air that may adversely affect the movement of the diaphragm 110. In some embodiments, the particles may, for example, be by-products from and/or chemicals used in a laser dicing process implemented to form the MEMS microphone 100. The particles interacting with the diaphragm 110 may decrease a performance of the MEMS microphone 100 by, for example, causing short circuits (e.g., between the first and second back plates 108, 112 and the diaphragm 110) and/or decreasing an acoustic overload point (AOP) of the MEMS microphone 100.

By disposing the particle filter 106 over the carrier substrate 103, a time and costs associated with fabricating the MEMS microphone 100 is reduced. Additionally, the carrier substrate 103, the upper dielectric layer 104c, and the lower dielectric layer 104a may provide structural support for the particle filter 106 during fabrication of the MEMS microphone 100. For example, during a fabrication of the MEMS microphone 100, the filter stack 104 may be formed over the carrier substrate 103, and subsequently the upper dielectric layer 104c may be bonded to the MEMS substrate 111. The carrier substrate 103, the upper dielectric layer 104c, and the lower dielectric layer 104a prevent damage or destruction to the particle filter layer 104b during the aforementioned bonding process. Further, by disposing the particle filter layer 104b between the upper and lower dielectric layers 104c, 104a, an exposure of particles directly to the particle filter 106 during fabrication of the MEMS microphone 100 may be reduced, thereby increasing an endurance and reliability of the MEMS microphone 100.

Figure 2A:
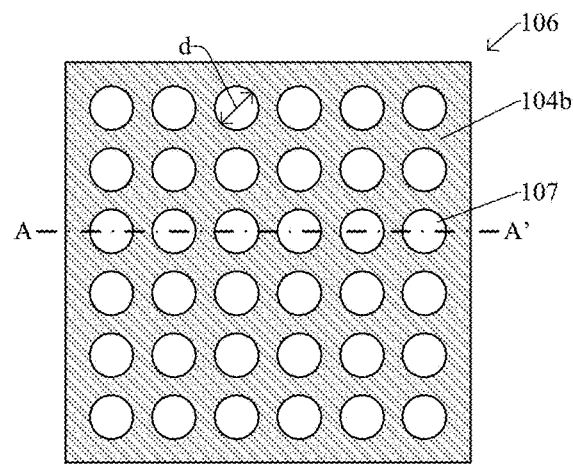
FIGS. 2A and 2B illustrate top views of alternative embodiments of the MEMS microphone of FIG. 1.

Referring to FIG. 2A, a top view 200a of some alternative embodiments of the particle filter 106 of FIG. 1 along the line A-A' is provided.

As seen in FIG. 2A, the plurality of filter openings 107 disposed in the particle filter layer 104b each have a circular and/or elliptical shape. The plurality of filter openings 107 may be arranged as an array comprising columns and rows across the carrier substrate opening 101 of FIG. 1. The particle filter 106 is configured to block and/or remove particles (e.g., by a shape/size of the filter openings 107 and/or a material of the particle filter layer 104b) from air that passes from a first surface of the particle filter 106 to an opposite second surface of the particle filter 106.

In some embodiments, the filter openings 107 each have a diameter d that may, for example, be within a range of about 3 to 10 micrometers. In some embodiments, if the diameter d is less than about 3 micrometers, then an ability to pass air from the first surface of the particle filter 106 to the opposite second surface of that particle filter 106 may be mitigated, thereby decreasing a performance of the MEMS device structure 102. In further embodiments, if the diameter d is greater than about 10 micrometers, then an ability of the particle filter 106 to block and/or remove particles from the air that passes through the particle filter 106 may be reduced. For example, the particle filter openings 107 may be larger than the particles, such that the particles may pass through the particle filter openings and adversely affect the movement of the diaphragm (110 of FIG. 1).

Figure 2B:
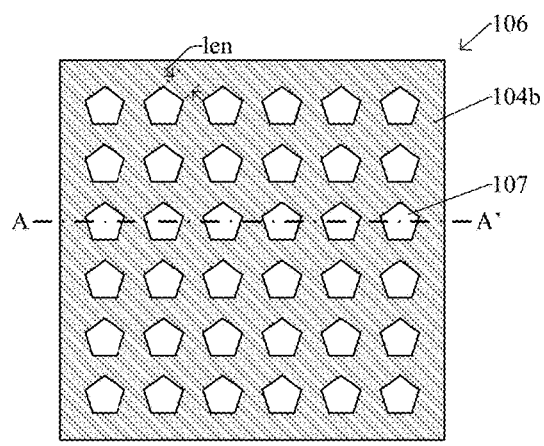

Referring to FIG. 2B, a top view 200b of some alternative embodiments of the particle filter 106 of FIG. 1 along the line A-A' is provided.

As seen in FIG. 2B, the plurality of filter openings 107 disposed in the particle filter layer 104b each have a polygon shape. The polygon shape may be any polygon, for example, a triangle, a rectangle, a pentagon, a hexagon, etc. The plurality of filter openings 107 may be arranged as an array comprising columns and rows across the carrier substrate opening 101 of FIG. 1. The particle filter 106 is configured to block and/or remove particles (e.g., by a shape/size of the filter openings 107 and/or a material of the particle filter layer 104b) from air that passes from a first surface of the particle filter 106 to an opposite second surface of the particle filter 106.

In some embodiments, one or more sides of each filter opening 107 have a length len that may, for example, be within a range of about 3 to 10 micrometers. In some embodiments, if the length len is less than about 3 micrometers, then an ability to pass air from the first surface of the particle filter 106 to the opposite second surface of that particle filter 106 may be mitigated, thereby decreasing a performance of the MEMS device structure 102. In further embodiments, if the length len is greater than about 10 micrometers, then an ability of the particle filter 106 to block and/or remove particles from the air that passes through the particle filter 106 may be reduced. For example, the particle filter openings 107 may be larger than the particles, such that the particles may pass through the particle filter openings and adversely affect the movement of the diaphragm (110 of FIG. 1).

Figure 3:
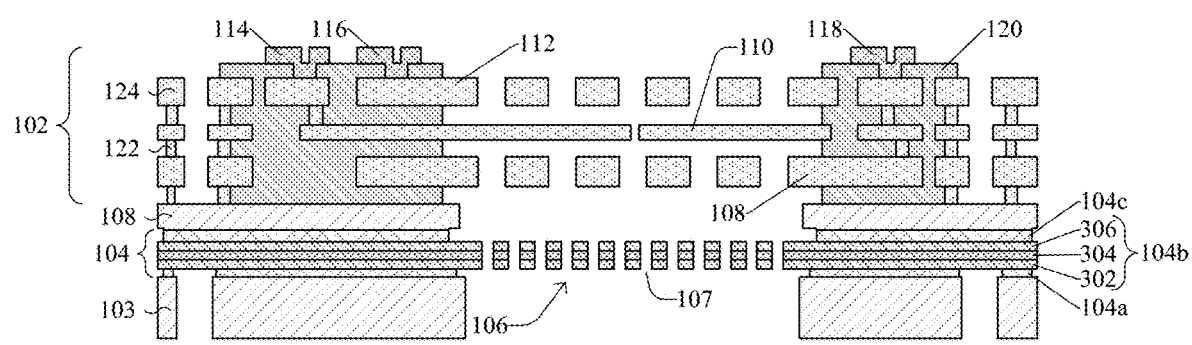
FIG. 3 illustrates a cross-sectional view of some embodiments of a microelectromechanical systems (MEMS) microphone with a particle filter.

Referring to FIG. 3, a cross-sectional view of a MEMS microphone 300 corresponding to some alternative embodiments of the MEMS microphone 100 of FIG. 1 is provided.

In some embodiments, the particle filter layer 104b comprises a lower particle filter layer 302, a middle particle filter layer 304, and an upper particle filter layer 306. The lower particle filter layer 302 may, for example, be or comprise silicon, a nitride, silicon nitride, or the like and/or have a thickness within a range of about 0.2 to 1 micrometer. The middle particle filter layer 304 may, for example, be or comprise polysilicon, un-doped polysilicon, or the like and/or have a thickness within a range of about 0.2 to 1 micrometer. The upper particle filter layer 306 may, for example, be or comprise silicon, a nitride, silicon nitride, or the like and/or have a thickness within a range of about 0.2 to 1 micrometer. In some embodiments, the layers within the particle filter layer 104b may each have a substantially same thickness. In further embodiments, the lower particle filter layer 302 and the upper particle filter layer 306 may comprise a same material (e.g., silicon nitride). In some embodiments, the particle filter layer 104b including a polysilicon layer (e.g., the middle particle filter layer 304) disposed between two silicon nitride layers (e.g., the lower and upper particle filter layers 302, 306) will decrease a stress induced upon the particle filter 106, thereby increasing a structural integrity and reliability of the particle filter 106.

Figure 4:
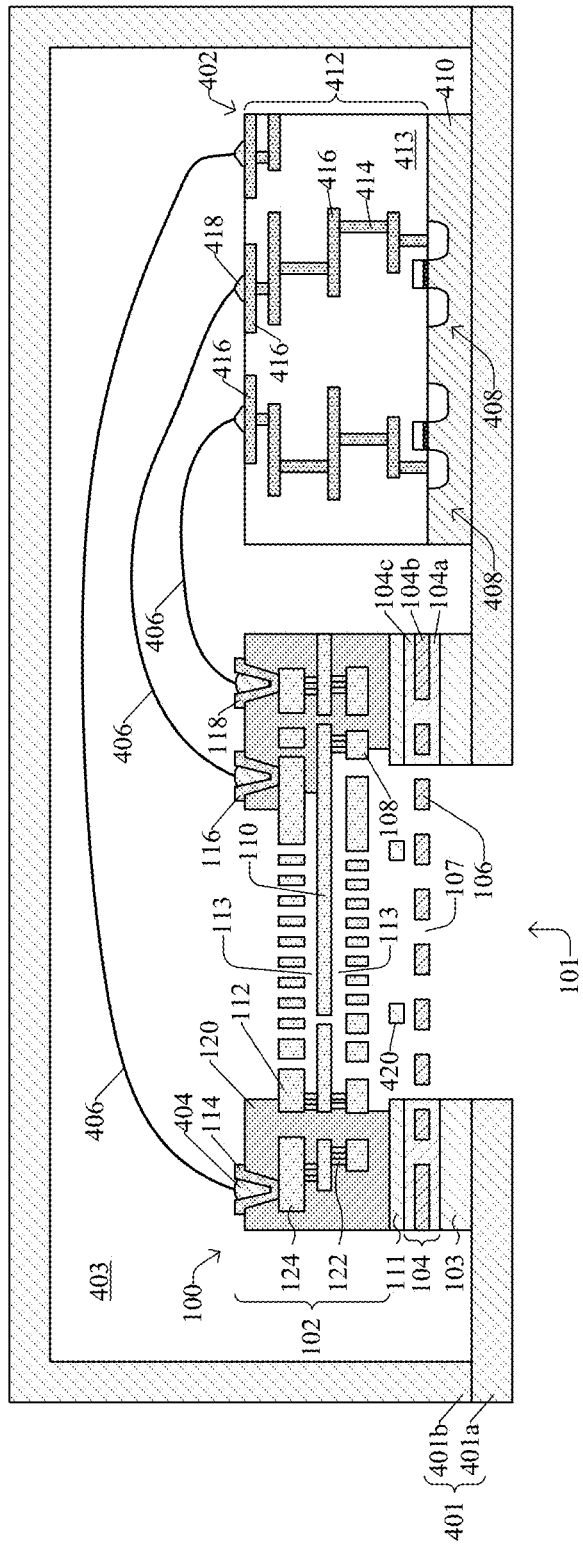
FIG. 4 illustrates a cross-sectional view of some embodiments of an integrated chip including some embodiments of the MEMS microphone of FIG. 1 wire bonded to a complementary metal-oxide-semiconductor (CMOS) integrated circuit (IC) die.

Referring to FIG. 4, a cross-sectional view of some embodiments of an integrated chip 400 including some alternative embodiments of the MEMS microphone 100 of FIG. 1 wire bonded to a complementary metal-oxide-semiconductor (CMOS) integrated circuit (IC) die 402 is provided.

The integrated chip 400 includes the MEMS microphone 100 laterally adjacent to the CMOS IC die 402 and disposed within a cavity 403. In some embodiments, the MEMS substrate 111 of the MEMS microphone 100 includes pillar structures 420 configured to increase a structural integrity of the MEMS microphone 100. In some embodiments, the CMOS IC die 402 may be an application-specific integrated circuit (ASIC). In some embodiments, the cavity 403 is defined by inner sidewalls of a package 401. The package 401 includes a front-side structure 401a and an enclosure structure 401b. The CMOS IC die 402 and the MEMS microphone 100 are disposed on the front-side structure 401a. In some embodiments, an opening (i.e., inlet) to the package 401 may be the carrier substrate opening 101 of the MEMS microphone 100, such that any air entering or leaving the cavity 403 passes through the particle filter 106.

The CMOS IC die 402 includes a back-end-of-line (BEOL) metallization stack 412 overlying a CMOS substrate 410. An inter-level dielectric (ILD) structure 413 overlies the CMOS substrate 410. The CMOS substrate 410 and the ILD structure 413 include electronic components such as transistors 408, and/or other electric components (not shown), such as one or more capacitors, resistors, inductors, or diodes. The CMOS substrate 410 may, for example, be or comprise a bulk semiconductor substrate or a silicon-on-insulator (SOI) substrate. The BEOL metallization stack 412 includes the ILD structure 413, interconnect wires 416, and interconnect vias 414. The ILD structure 413 may comprise one or more stacked ILD layers, which respectively comprise a low-k dielectric (i.e., a dielectric material with a dielectric constant less than about 3.9), and oxide, or the like. The interconnect vias and wires 414, 416 may, for example, respectively be or comprise a conductive material, such as aluminum, copper, tungsten, or the like.

A solder ball 404 is disposed over each electrical contact 114, 116, 118. The solder balls 404 provide contact points for a plurality of bond wires 406. A bond pad 418 overlies a top layer of interconnect wires 416 and provides a wire bonding location for the bond wires 406. The transistors 408 are electrically coupled to the electrical contacts 114, 116, 118 by way of the BEOL metallization stack 412, the bond wires 406, and the bond pads 418. The transistors 408 may be configured to receive signals from the first back plate 108, the second back plate 112, and/or the diaphragm 110.

FIGS. 5-11 illustrate cross-sectional views 500-1100 of some embodiments of a first method of forming a MEMS microphone with a particle filter according to the present disclosure. Although the cross-sectional views 500-1100 shown in FIGS. 5-11 are described with reference to a method, it will be appreciated that the structures shown in FIGS. 5-11 are not limited to the method but rather may stand alone separate of the method. Furthermore, although FIGS. 5-11 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
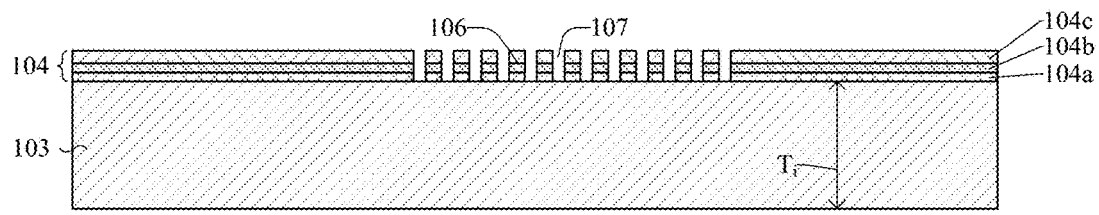
FIGS. 5-11 illustrate cross-sectional views of some embodiments of a first method of forming a MEMS microphone with a particle filter.

A shown in cross-sectional view 500 of FIG. 5, a carrier substrate 103 is provided. In some embodiments, the carrier substrate 103 may be, for example, a bulk substrate (e.g., a bulk silicon substrate), a silicon-on-insulator (SOI) substrate, or some other suitable substrate and/or may have an initial thickness $T_i$ within a range of approximately 250 to 725 micrometers. A filter stack 104 is formed over the carrier substrate 103. The filter stack 104 includes a lower dielectric layer 104a, a particle filter layer 104b, and an upper dielectric layer 104c. In some embodiments, a process for forming the filter stack 104 includes: depositing the lower dielectric layer 104a over the carrier substrate 103 and subsequently performing a first annealing process; depositing the particle filter layer 104b over the lower dielectric layer 104a and subsequently performing a second annealing process; and depositing an upper dielectric layer 104c over the particle filter layer 104b and subsequently performing a third annealing process. In some embodiments, the aforementioned layers of the filter stack 104 may respectively, for example, be deposited and/or grown by chemical vapor deposition (CVD), physical vapor deposition (PVD), atomic layer deposition (ALD), thermal oxidation, or another suitable deposition process.

In some embodiments, the lower dielectric layer 104a may, for example, be or comprise an oxide, such as silicon dioxide, or another dielectric material formed to a thickness within a range of about 0.5 to 10 micrometers. In some embodiments, the particle filter layer 104b may, for example, be or comprise a nitride, such as silicon nitride, or the like formed to a thickness within a range of about 0.1 to 3 micrometers. In some embodiments, the upper dielectric layer 104c may, for example, be or comprise an oxide, such as silicon dioxide, or another dielectric material formed to a thickness within a range of about 0.5 to 10 micrometers. In further embodiments, the lower dielectric layer 104a and the upper dielectric layer 104c may be or comprise the same material with approximately the same thickness.

Also shown in FIG. 5, the filter stack 104 is etched, thereby defining a plurality of filter openings 107 and a particle filter 106. In some embodiments, the etching process includes: forming a masking layer (not shown) over the upper dielectric layer 104c, exposing unmasked regions of the upper dielectric layer 104c to one or more etchants, and performing a removal process to remove the masking layer.

The carrier substrate 103, the upper dielectric layer 104c, and the lower dielectric layer 104a each provide structural support for the particle filter 106 and/or the particle filter layer 104b during subsequent processing steps. This, in part, reduces and/or eliminates damage to the particle filter layer 104b and/or particle filter 106 during fabrication.

Figure 6:
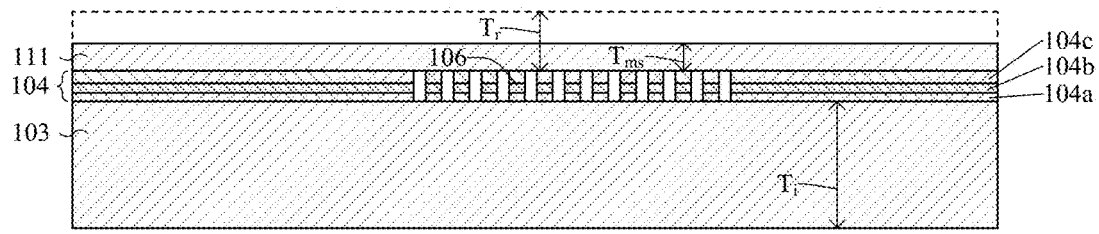

As shown in cross-sectional view 600 of FIG. 6, a MEMS substrate 111 is provided and subsequently bonded to the upper dielectric layer 104c. In some embodiments, the bonding process may, for example, be a fusion bonding process, or another suitable bonding process. In some embodiments, the MEMS substrate 111 may be, for example, a bulk substrate (e.g., a bulk silicon substrate), a silicon-on-insulator (SOI) substrate, or some other suitable substrate with an initial thickness $T_r$. After performing the bonding process, a thinning process is performed on the MEMS substrate 111 to reduce the initial thickness $T_r$ of the MEMS substrate 111 to a thickness $T_{ms}$. In some embodiments, the thickness $T_{ms}$ is within a range of about 10 to 200 micrometers. In some embodiments, the thinning process is performed by a mechanical grinding process, a chemical mechanical polish (CMP), some other thinning process, or any combination of the foregoing. For example, the thinning process may be performed wholly by a mechanical grinding process.

Figure 7:
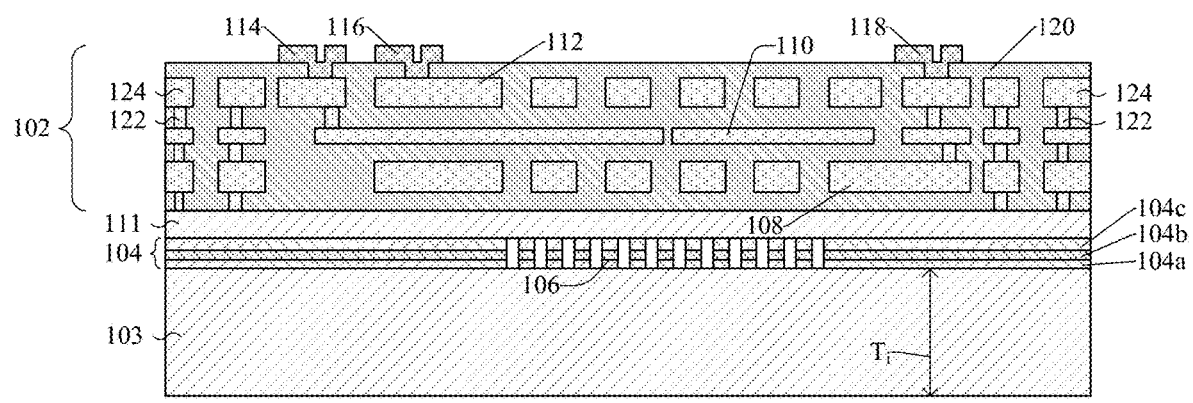

As shown in cross-sectional view 700 of FIG. 7, a MEMS device structure 102 is formed over the MEMS substrate 111. The MEMS device structure 102 includes conductive wires 124, conductive vias 122, an inter-level dielectric (ILD) structure 120, a first back plate 108, a second back plate 112, and a diaphragm 110 disposed between the first and second back plates 108, 112. The ILD structure 120 may be one or more dielectric layers. The one or more dielectric layers may, for example, be or comprise an oxide, such as silicon dioxide, or another suitable oxide. In some embodiments, a process for forming the MEMS device structure 102 includes forming a bottommost layer of the conductive vias 122 by a single damascene process, and subsequently forming a bottommost layer of the conductive wires 124 by the single damascene process. Further, in some embodiments, the process comprises forming remaining layers of the conductive vias and wires 122, 124 by repeatedly performing a dual damascene process. Additionally, the first back plate 108, the second back plate 112, and the diaphragm 110 may be formed during the dual damascene process or the single damascene process of a corresponding layer of the conductive wires 124. For example, the first back plate 108 may be formed concurrently with the single damascene process used to form the bottommost layer of the conductive wires 124. In another example, the first back plate 108, the second back plate 112, and the diaphragm 110 may each be formed by depositing a layer of polysilicon (e.g., by CVD, PVD, or another suitable deposition process), patterning the layer of polysilicon according to a masking layer (not shown), and performing a removal process to remove the masking layer.

In some embodiments, the single damascene process comprises depositing a dielectric layer, patterning the dielectric layer with openings for a single layer of conductive features (e.g., a layer of vias, wires, a back plate, and/or a diaphragm), and filling the openings with conductive material (e.g., polysilicon) to form the single layer of conductive features. The dielectric layer may, for example, correspond to the one or more dielectric layers in the ILD structure 120. In some embodiments, the dual damascene process comprises depositing a dielectric layer, patterning the dielectric layer with openings for two layers of conductive features (e.g., a layer of vias and a layer of wires, back plate, and/or a diaphragm), and filling the openings with conductive material (e.g., polysilicon) to form the two layers of conductive features. In some embodiments, the conductive wires 124, the conductive vias 122, the first back plate 108, the second back plate 112, and the diaphragm 110 may, for example, respectively comprise polysilicon, or another suitable conductive material.

Also as shown in FIG. 7, the process for forming the MEMS device structure 102 further includes forming electrical contacts 114, 116, 118. In some embodiments, a process for forming the aforementioned electrical contacts includes: forming a masking layer (not shown) over the ILD structure 120; patterning the ILD structure 120 according to the masking layer; and depositing the electrical contacts 114, 116, 118 over the ILD structure 120. The aforementioned electrical contacts may, for example, be deposited and/or grown by electroless plating, sputtering, electroplating, or another suitable deposition process. In some embodiments, the electrical contacts 114, 116, 118 may, for example, respectively be or comprise gold, nickel, or the like.

Figure 8:
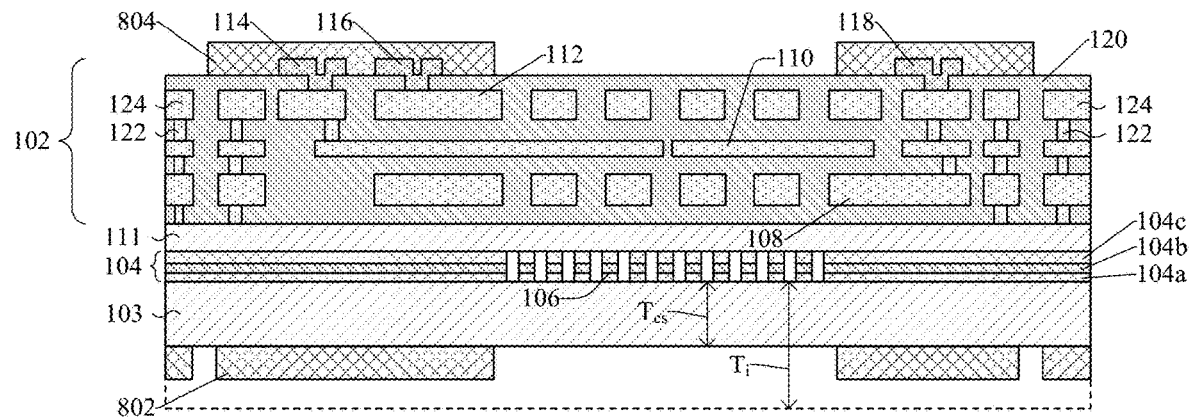

As shown in cross-sectional view 800 of FIG. 8, a thinning process is performed on the carrier substrate 103 to reduce an initial thickness $T_i$ of the carrier substrate 103 to a thickness $T_{cs}$. In some embodiments, the thickness $T_{cs}$ is within a range of about 200 to 400 micrometers. In some embodiments, the thinning process is performed by a mechanical grinding process, a chemical mechanical polish (CMP), some other thinning process, or any combination of the foregoing. For example, the thinning process may be performed wholly by a mechanical grinding process. After performing the thinning process, a lower masking layer 802 is formed on a bottom surface of the carrier substrate 103 and an upper masking layer 804 is formed over the ILD structure 120. In some embodiments, the lower masking layer 802 and/or the upper masking layer 804 may, for example, respectively be or comprise a photoresist, a hard mask layer, or the like. The lower masking layer 802 and the upper masking layer 804 respectively have a plurality of sidewalls defining a plurality of openings.

Figure 9:
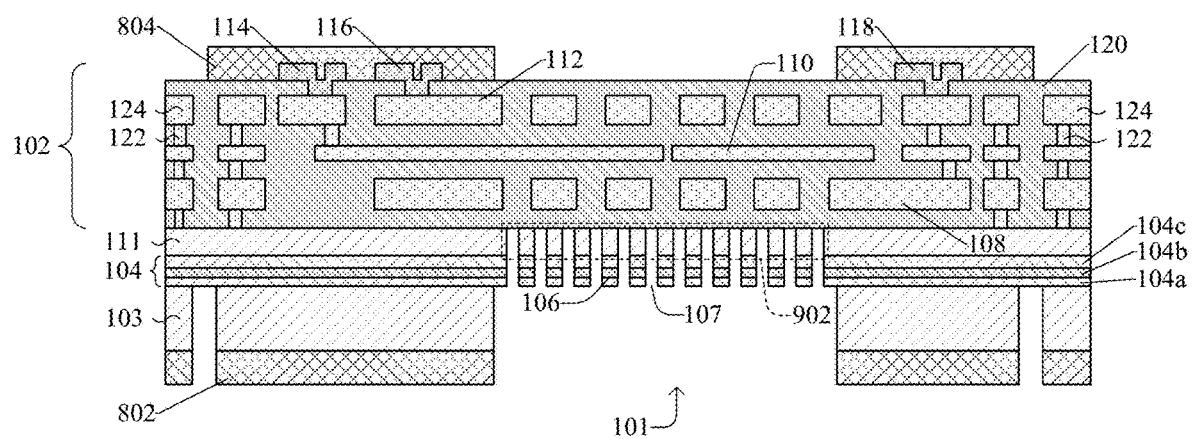

As shown in cross-sectional view 900 of FIG. 9, a first patterning process is performed on the carrier substrate 103 and the MEMS substrate 111 according to the lower masking layer 802. In some embodiments, the first patterning process includes performing a dry etching process, such as a plasma etching process and/or a deep reactive-ion etching (DRIE) process. The first patterning process defines the carrier substrate opening 101 directly underlying the particle filter 106. Additionally, the first patterning process defines a plurality of pillars 902 from the MEMS substrate 111. In some embodiments, after the first patterning process, the MEMS substrate 111 comprises a plurality of openings that correspond to a shape of the plurality of the filter openings 107 of the particle filter 106.

Figure 10:
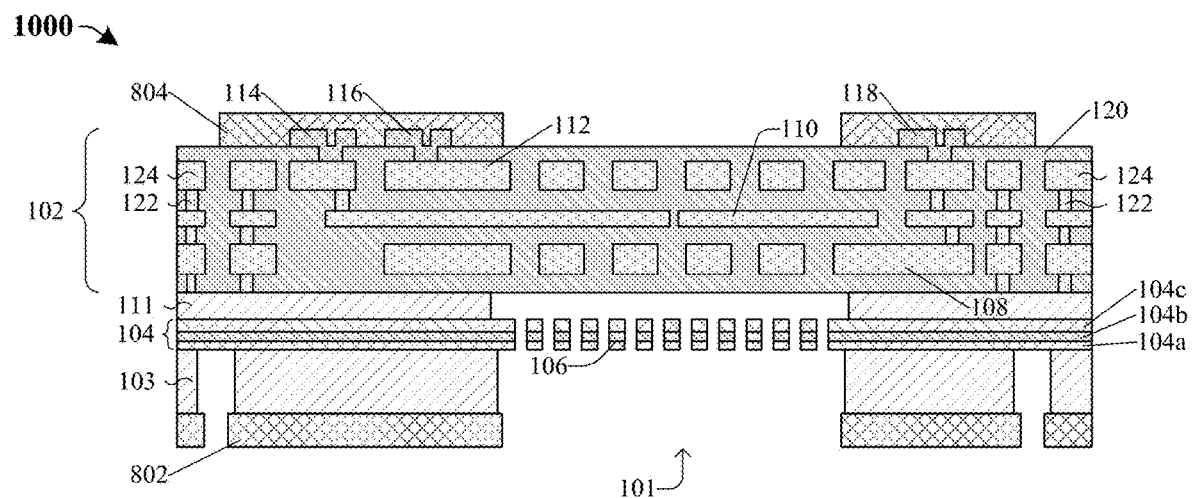

As shown in cross-sectional view 1000 of FIG. 10, a second patterning process is performed on the carrier substrate 103 and the MEMS substrate 111 according to the lower masking layer 802. In some embodiments, the second patterning process includes performing a wet etching process, such as an isotropic etching process and/or a dry etching process. The second patterning process may include exposing the carrier substrate 103 and/or the MEMS substrate 111 to one or more etchants, such as, for example, xenon difluoride ($XeF_2$). The second patterning process removes the plurality of pillars (902 of FIG. 9) and expands the carrier substrate opening 101.

Figure 11:
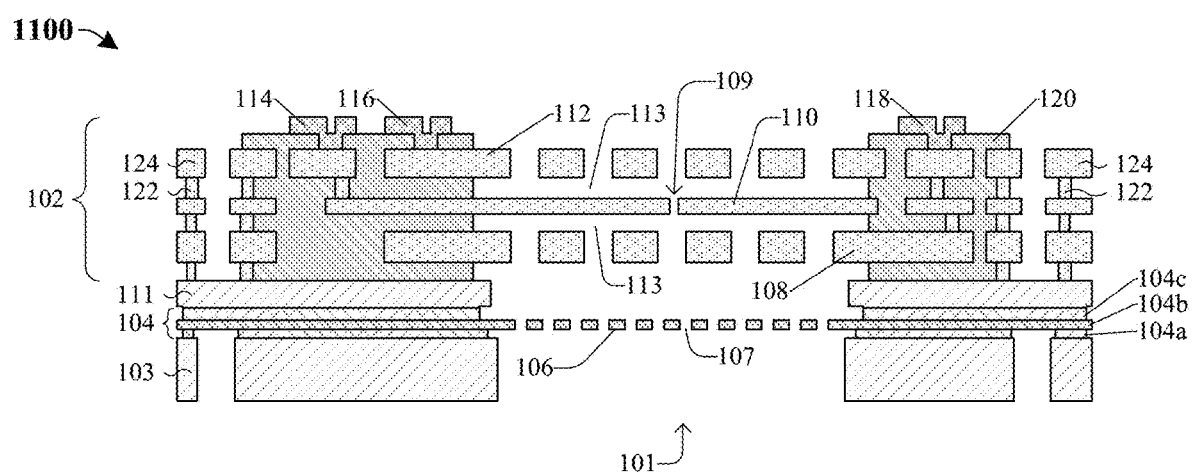

As shown in cross-sectional view 1100 of FIG. 11, a third patterning process is performed on the structure of FIG. 10 according to the lower masking layer (802 of FIG. 10) and the upper masking layer (804 of FIG. 10). In some embodiments, the third patterning process includes performing a wet etching process. In some embodiments, the third patterning process includes exposing the structure of FIG. 10 to one or more etchants. The third patterning process removes a portion of the ILD structure 120 thereby defining the air volume space 113. Further, the third patterning process removes the lower dielectric layer 104a from a bottom surface of the particle filter 106 and removes the upper dielectric layer 104c from a top surface of the particle filter 106. After performing the third patterning process, a removal process is performed to remove the lower and upper masking layers (802, 804 of FIG. 10).

Figure 12:
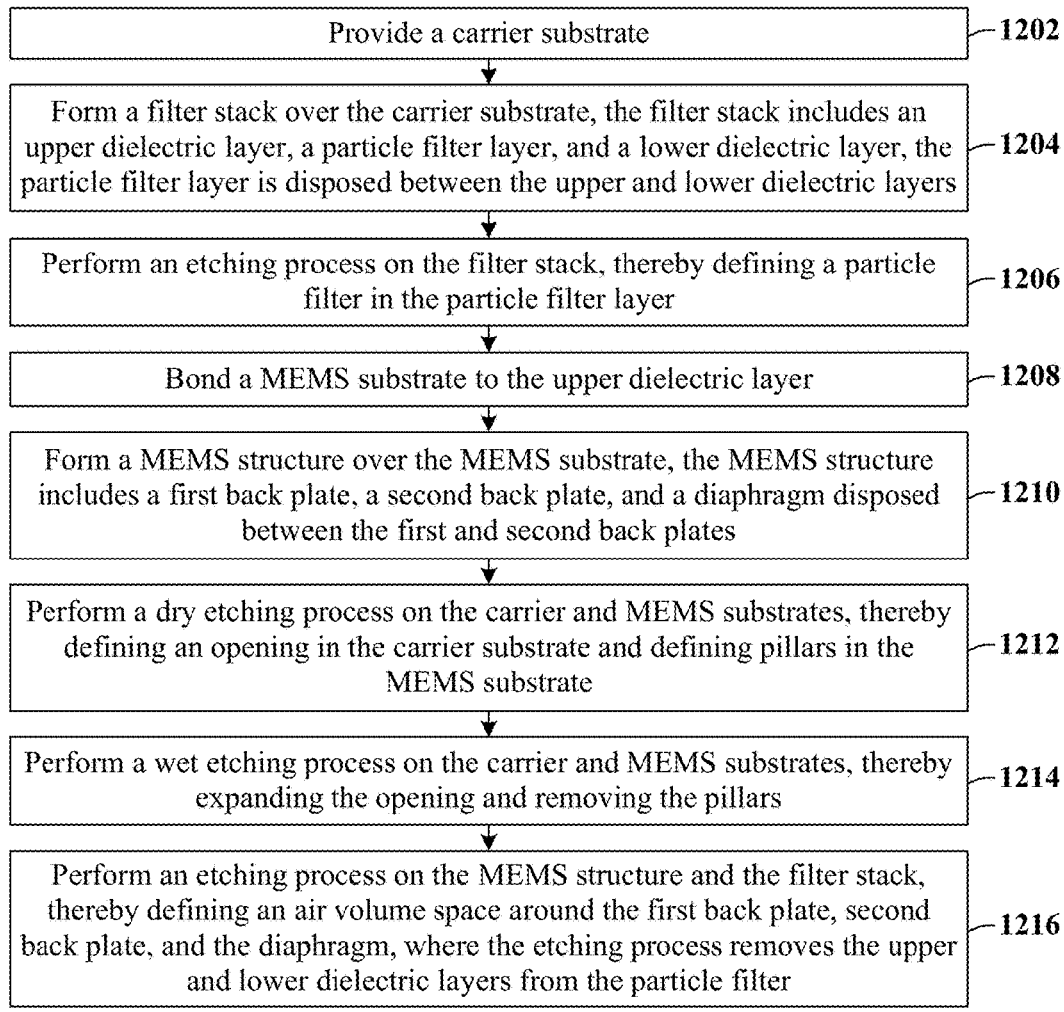
FIG. 12 illustrates a methodology in flowchart format that illustrates some embodiments of the first method of forming a MEMS microphone with a particle filter.

FIG. 12 illustrates a first method 1200 of forming a MEMS microphone with a particle filter in accordance with some embodiments. Although the first method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, a carrier substrate is provided. FIG. 5 illustrates a cross-sectional view 500 corresponding to some embodiments of act 1202.

At act 1204 a filter stack is formed over the carrier substrate. The filter stack includes an upper dielectric layer, a particle filter layer, and a lower dielectric layer, the particle filter layer is disposed between the upper and lower dielectric layers. FIG. 5 illustrates a cross-sectional view 500 corresponding to some embodiments of act 1204.

At act 1206, an etching process is performed on the filter stack, thereby defining a particle filter in the particle filter layer. FIG. 5 illustrates a cross-sectional view 500 corresponding to some embodiments of act 1206.

At act 1208, a MEMS substrate is bonded to the upper dielectric layer. FIG. 6 illustrates a cross-sectional view 600 corresponding to some embodiments of act 1208.

At act 1210, a MEMS structure is formed over the MEMS substrate. The MEMS structure includes a first back plate, a second back plate, and a diaphragm disposed between the first and second back plates. FIG. 7 illustrates a cross-sectional view 700 corresponding to some embodiments of act 1210.

At act 1212, a dry etching process is performed on the carrier and MEMS substrates, thereby defining an opening in the carrier substrate and defining pillars in the MEMS substrate. FIG. 9 illustrates a cross-sectional view 900 corresponding to some embodiments of act 1212.

At act 1214, a wet etching process is performed on the carrier and MEMS substrates, thereby expanding the opening in the carrier substrate and removing the pillars. FIG. 10 illustrates a cross-sectional view 1000 corresponding to some embodiments of act 1214.

At act 1216, an etching process is performed on the MEMS structure and the filter stack, thereby defining an air volume space around the first back plate, second back plate, and the diaphragm. The etching process removes the upper and lower dielectric layers from the particle filter. FIG. 11 illustrates a cross-sectional view 1100 corresponding to some embodiments of act 1216.

FIGS. 13-20 illustrate cross-sectional views 1300-2000 of some embodiments of a second method of forming a MEMS microphone with a particle filter according to the present disclosure. Although the cross-sectional views 1300-2000 shown in FIGS. 13-20 are described with reference to a method, it will be appreciated that the structures shown in FIGS. 13-20 are not limited to the method but rather may stand alone separate of the method. Furthermore, although FIGS. 13-20 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 13:
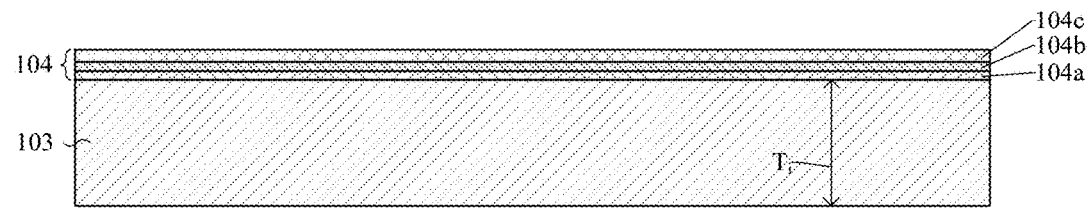
FIGS. 13-20 illustrate cross-sectional views of some embodiments of a second method of forming a MEMS microphone with a particle filter.

A shown in cross-sectional view 1300 of FIG. 13, a carrier substrate 103 is provided. In some embodiments, the carrier substrate 103 may be, for example, a bulk substrate (e.g., a bulk silicon substrate), a silicon-on-insulator (SOI) substrate, or some other suitable substrate and/or may have an initial thickness $T_i$ within a range of approximately 250 to 725 micrometers. A filter stack 104 is formed over the carrier substrate 103. The filter stack 104 includes a lower dielectric layer 104a, a particle filter layer 104b, and an upper dielectric layer 104c. In some embodiments, a process for forming the filter stack 104 includes: depositing the lower dielectric layer 104a over the carrier substrate 103 and subsequently performing a first annealing process; depositing the particle filter layer 104b over the lower dielectric layer 104a and subsequently performing a second annealing process; and depositing an upper dielectric layer 104c over the particle filter layer 104b and subsequently performing a third annealing process. In some embodiments, the aforementioned layers of the filter stack 104 may respectively, for example, be deposited and/or grown by chemical vapor deposition (CVD), physical vapor deposition (PVD), atomic layer deposition (ALD), thermal oxidation, or another suitable deposition process. In some embodiments, the lower dielectric layer 104a may, for example, be or comprise an oxide, such as silicon dioxide, or another dielectric material formed to a thickness within a range of about 0.5 to 10 micrometers. In some embodiments, the particle filter layer 104b may, for example, be or comprise a nitride, such as silicon nitride, or the like formed to a thickness within a range of about 0.1 to 3 micrometers. In some embodiments, the upper dielectric layer 104c may, for example, be or comprise an oxide, such as silicon dioxide, or another dielectric material formed to a thickness within a range of about 0.5 to 10 micrometers. In further embodiments, the lower dielectric layer 104a and the upper dielectric layer 104c may be or comprise the same material with the approximately same thickness.

Figure 14:
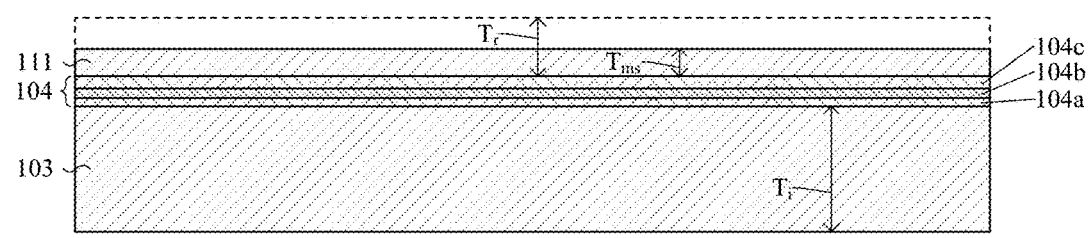

As shown in cross-sectional view 1400 of FIG. 14, a MEMS substrate 111 is provided and subsequently bonded to the upper dielectric layer 104c. In some embodiments, the bonding process may, for example, be a fusion bonding process, or another suitable bonding process. In some embodiments, the MEMS substrate 111 may be, for example, a bulk substrate (e.g., a bulk silicon substrate), a silicon-on-insulator (SOI) substrate, or some other suitable substrate with an initial thickness $T_r$. After performing the bonding process, a thinning process is performed on the MEMS substrate 111 to reduce the initial thickness $T_r$ of the MEMS substrate 111 to a thickness $T_{ms}$. In some embodiments, the thickness $T_{ms}$ is within a range of about 10 to 200 micrometers. In some embodiments, the thinning process is performed by a mechanical grinding process, a chemical mechanical polish (CMP), some other thinning process, or any combination of the foregoing. For example, the thinning process may be performed wholly by a mechanical grinding process.

Figure 15:
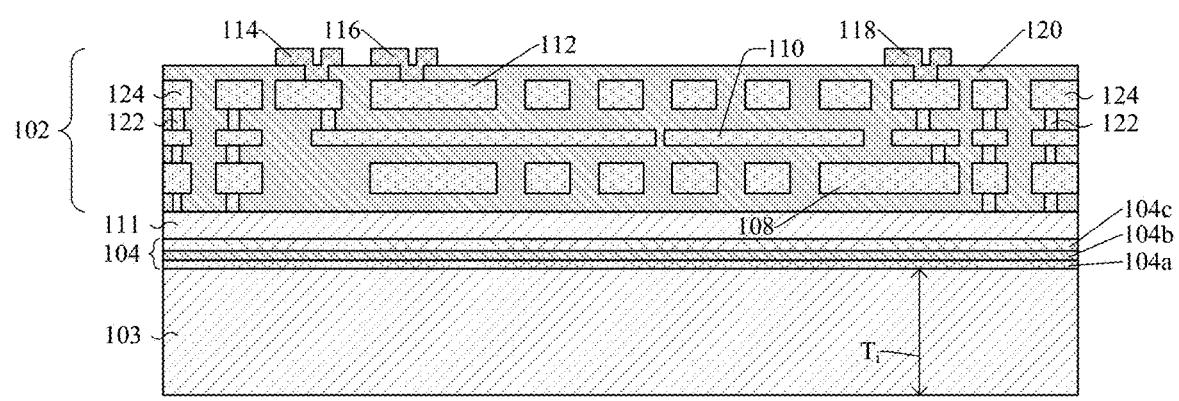

As shown in cross-sectional view 1500 of FIG. 15, a MEMS device structure 102 is formed over the MEMS substrate 111. The MEMS device structure 102 includes conductive wires 124, conductive vias 122, an inter-level dielectric (ILD) structure 120, a first back plate 108, a second back plate 112, and a diaphragm 110 disposed between the first and second back plates 108, 112. The ILD structure 120 may be one or more dielectric layers. In some embodiments, the MEMS device structure 102 is formed as illustrated and/or described in FIG. 7.

Figure 16:
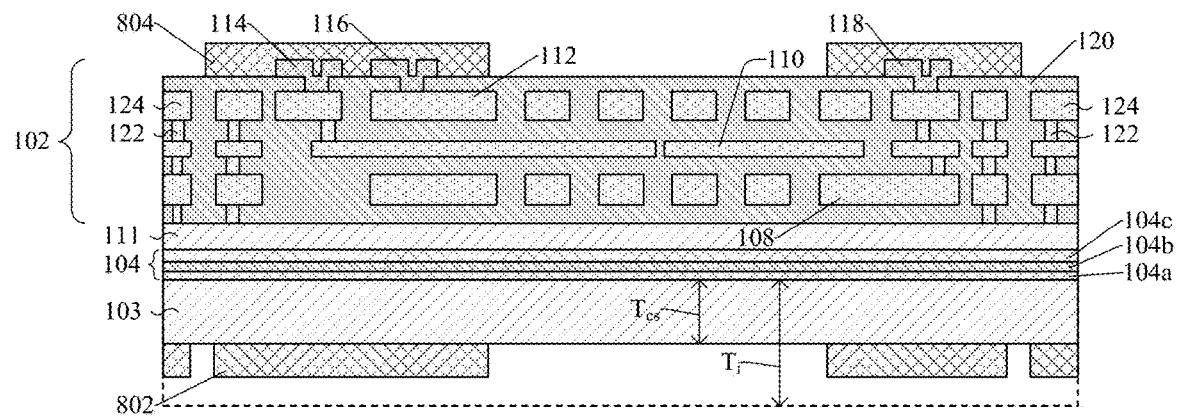

As shown in cross-sectional view 1600 of FIG. 16, a thinning process is performed on the carrier substrate 103 to reduce an initial thickness $T_i$ of the carrier substrate 103 to a thickness $T_{cs}$. In some embodiments, the thickness $T_{cs}$ is within a range of about 200 to 400 micrometers. In some embodiments, the thinning process is performed by a mechanical grinding process, a chemical mechanical polish (CMP), some other thinning process, or any combination of the foregoing. For example, the thinning process may be performed wholly by a mechanical grinding process. After performing the thinning process, a lower masking layer 802 is formed on a bottom surface of the carrier substrate 103 and an upper masking layer 804 is formed over the ILD structure 120. In some embodiments, the lower masking layer 802 and/or the upper masking layer 804 may, for example, respectively be or comprise a photoresist, a hard mask layer, or the like. The lower masking layer 802 and the upper masking layer 804 respectively have a plurality of sidewalls defining a plurality of openings.

Figure 17:
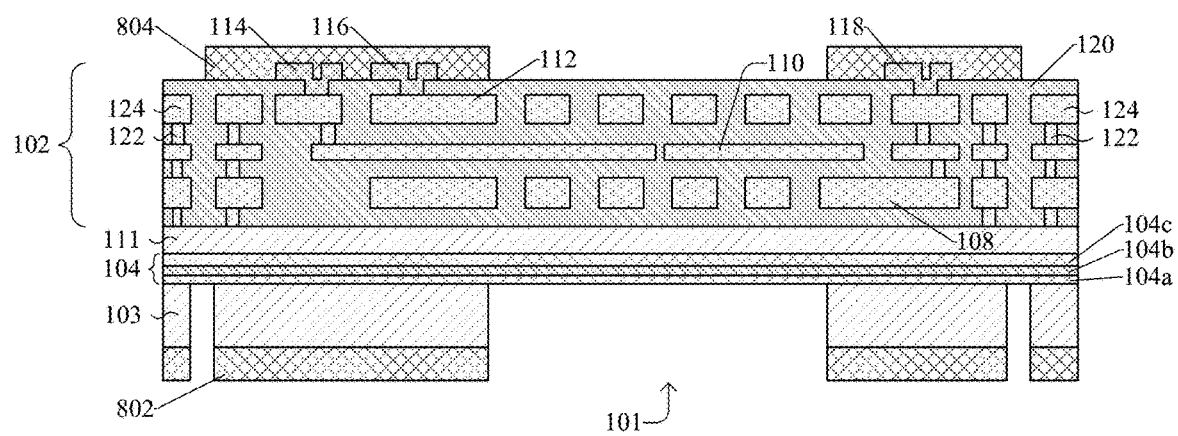

As shown in cross-sectional view 1700 of FIG. 17, a first patterning process is performed on the carrier substrate 103 according to the lower masking layer 802. In some embodiments, the first patterning process includes performing a dry etching process, such as a plasma etching process and/or a deep reactive-ion etching (DRIE) process. The first patterning process defines the carrier substrate opening 101 directly underlying the filter stack 104 and exposes a bottom surface of the lower dielectric layer 104a. In further embodiments, after performing the first patterning process, a removal process is performed to remove the lower masking layer 802 (not shown).

Figure 18:
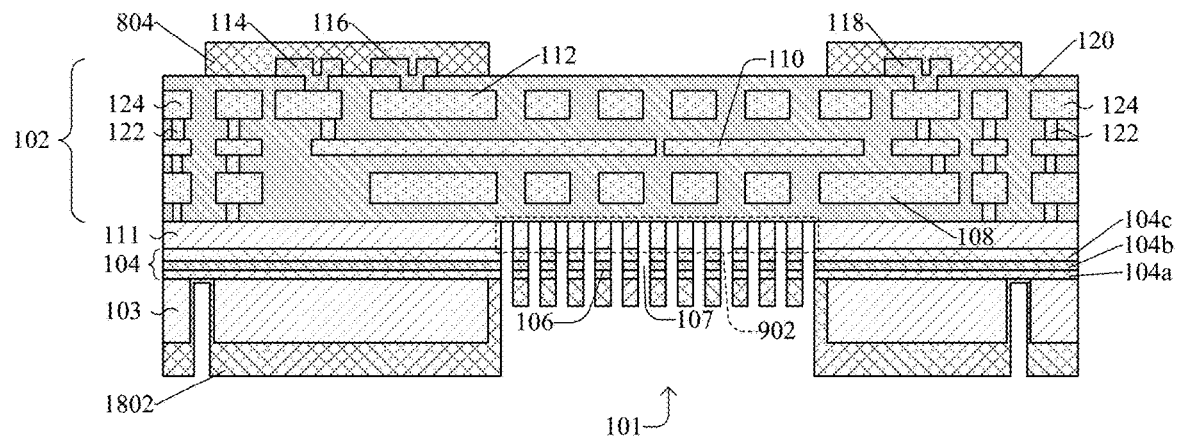

As shown in cross-sectional view 1800 of FIG. 18, another lower masking layer 1802 is formed over the carrier substrate 103 and the bottom surface of the lower dielectric layer 104a. In some embodiments, the another lower masking layer 1802 protects the carrier substrate 103 from subsequent etching processes. After forming the another lower masking layer 1802, a second patterning process is performed on the filter stack 104 and the MEMS substrate 111. This, in part, defines a plurality of pillars 902 in the MEMS substrate 111 and defines a particle filter 106 in the particle filter layer 104b. In some embodiments, the second patterning process includes performing a first dry etching process on the filter stack 104, thereby exposing unmasked portions of the filter stack 104 to one or more first etchants. The second patterning process further includes performing a second dry etching process on the MEMS substrate 111, thereby exposing unmasked portions of the MEMS substrate to one or more second etchants. In some embodiments, the one or more first etchants are different than the one or more second etchants. Further, the first dry etching process defines the plurality of filter openings 107 of the particle filter 106.

Figure 19:
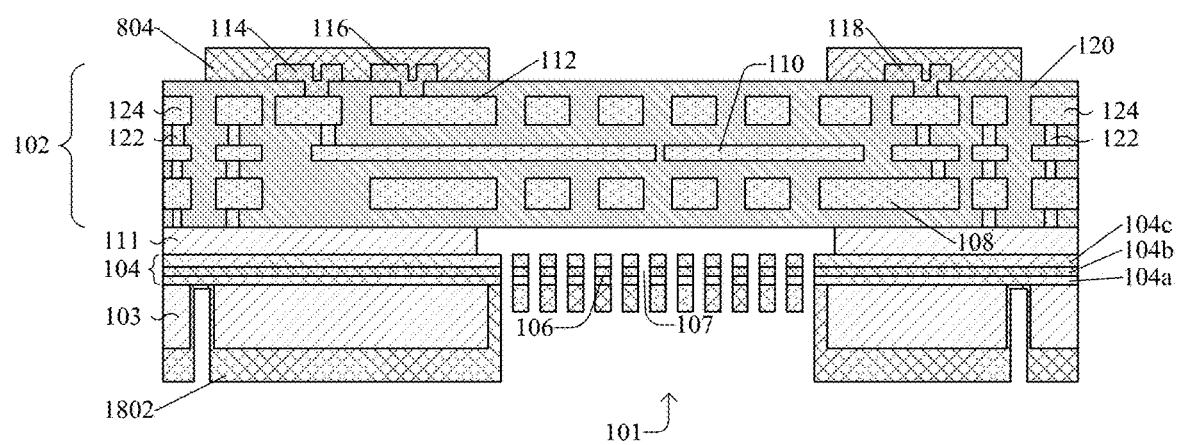

As shown in cross-sectional view 1900 of FIG. 19, a third patterning process is performed on the MEMS substrate 111. In some embodiments, the third patterning process includes performing a wet etching process, such as an isotropic etching process and/or a dry etching process. The third patterning process may include exposing the MEMS substrate 111 to one or more etchants, such as, for example, xenon difluoride (XeF$_2$). The third patterning process removes the plurality of pillars (902 of FIG. 18).

Figure 20:
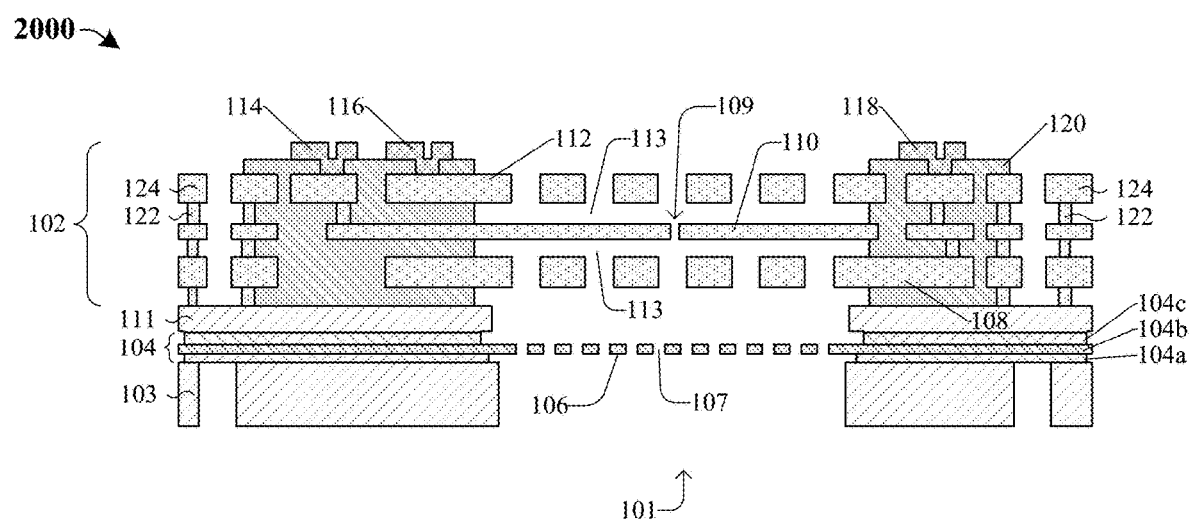

As shown in cross-sectional view 2000 of FIG. 20, a fourth patterning process is performed on the structure of FIG. 19. In some embodiments, the fourth patterning process includes performing a wet etching process and exposing the structure of FIG. 19 to one or more etchants. The fourth patterning removes a portion of the ILD structure 120 thereby defining the air volume space 113. Further, the fourth patterning process removes the lower dielectric layer 104a from a bottom surface of the particle filter 106 and removes the upper dielectric layer 104c from a top surface of the particle filter 106. After performing the fourth patterning process, a removal process is performed to remove the upper masking layer (804 of FIG. 19) and the another lower masking layer (1802 of FIG. 19).

Figure 21:
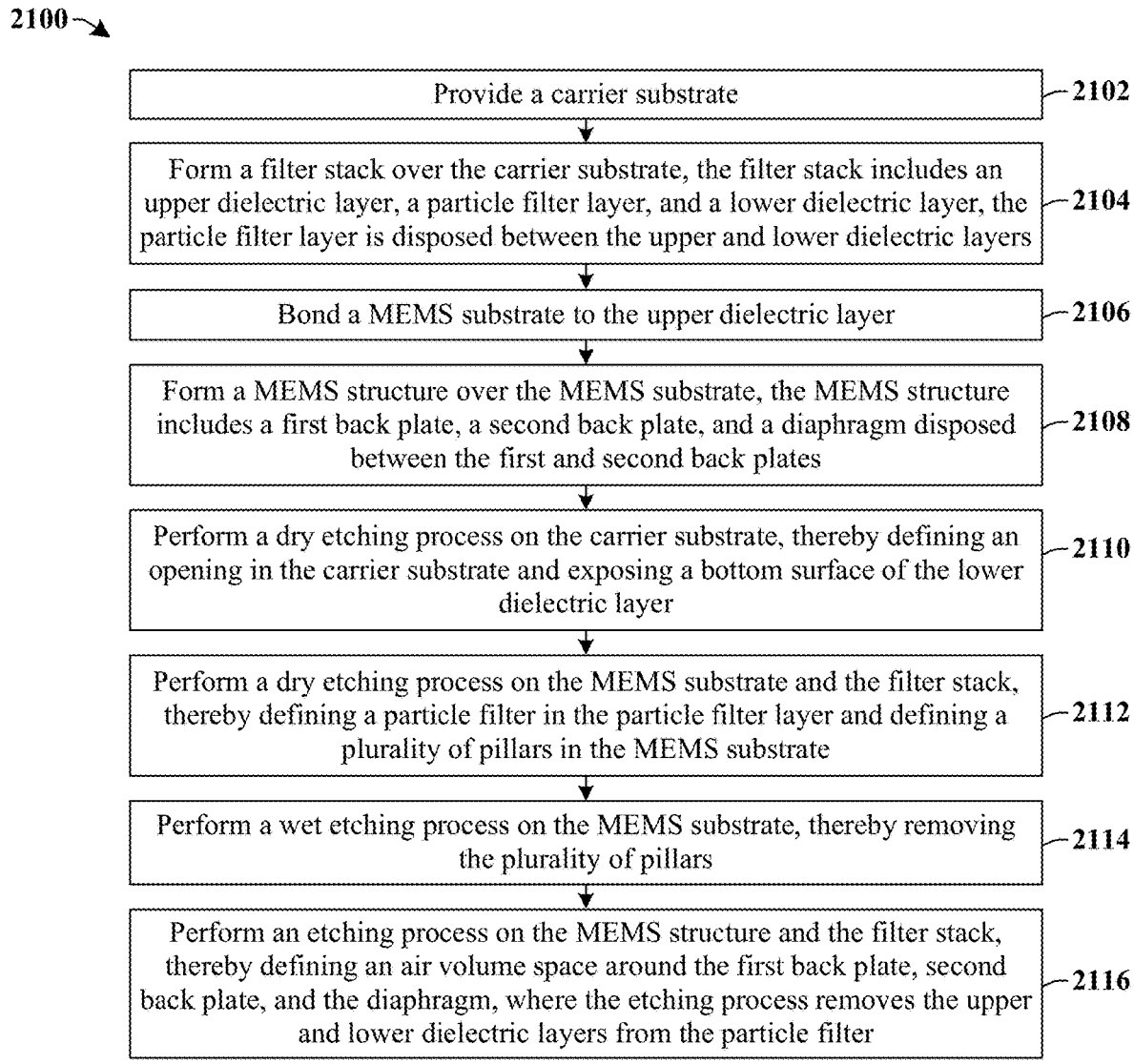
FIG. 21 illustrates a methodology in flowchart format that illustrates some embodiments of the second method of forming a MEMS microphone with a particle filter.

FIG. 21 illustrates a second method 2100 of forming a MEMS microphone with a particle filter in accordance with some embodiments. Although the second method 2100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2102, a carrier substrate is provided. FIG. 13 illustrates a cross-sectional view 1300 corresponding to some embodiments of act 2102.

At act 2104 a filter stack is formed over the carrier substrate. The filter stack includes an upper dielectric layer, a particle filter layer, and a lower dielectric layer, the particle filter layer is disposed between the upper and lower dielectric layers. FIG. 13 illustrates a cross-sectional view 1300 corresponding to some embodiments of act 2104.

At act 2106, a MEMS substrate is bonded to the upper dielectric layer. FIG. 14 illustrates a cross-sectional view 1400 corresponding to some embodiments of act 2106.

At act 2108, a MEMS structure is formed over the MEMS substrate. The MEMS structure includes a first back plate, a second back plate, and a diaphragm disposed between the first and second back plates. FIG. 15 illustrates a cross-sectional view 1500 corresponding to some embodiments of act 2108.

At act 2110, a dry etching process is performed on the carrier substrate, thereby defining an opening in the carrier substrate and exposing a bottom surface of the lower dielectric layer. FIG. 17 illustrates a cross-sectional view 1700 corresponding to some embodiments of act 2110.

At act 2112, a dry etching process is performed on the MEMS substrate and the filter stack, thereby defining a particle filter in the particle filter layer and defining a plurality of pillars in the MEMS substrate. FIG. 18 illustrates a cross-sectional view 1800 corresponding to some embodiments of act 2112.

At act 2114, a wet etching process is performed on the MEMS substrate, thereby removing the plurality of pillars. FIG. 19 illustrates a cross-sectional view 1900 corresponding to some embodiments of act 2114.

At act 2116, an etching process is performed on the MEMS structure and the filter stack, thereby defining an air volume space around the first back plate, second back plate, and the diaphragm. The etching process removes the upper and lower dielectric layers from the particle filter. FIG. 20 illustrates a cross-sectional view 2000 corresponding to some embodiments of act 2116.

FIGS. 22-29 illustrate cross-sectional views 2200-2900 of some embodiments of a third method of forming a MEMS microphone with a particle filter according to the present disclosure. Although the cross-sectional views 2200-2900 shown in FIGS. 22-29 are described with reference to a method, it will be appreciated that the structures shown in FIGS. 22-29 are not limited to the method but rather may stand alone separate of the method. Furthermore, although FIGS. 22-29 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 22:
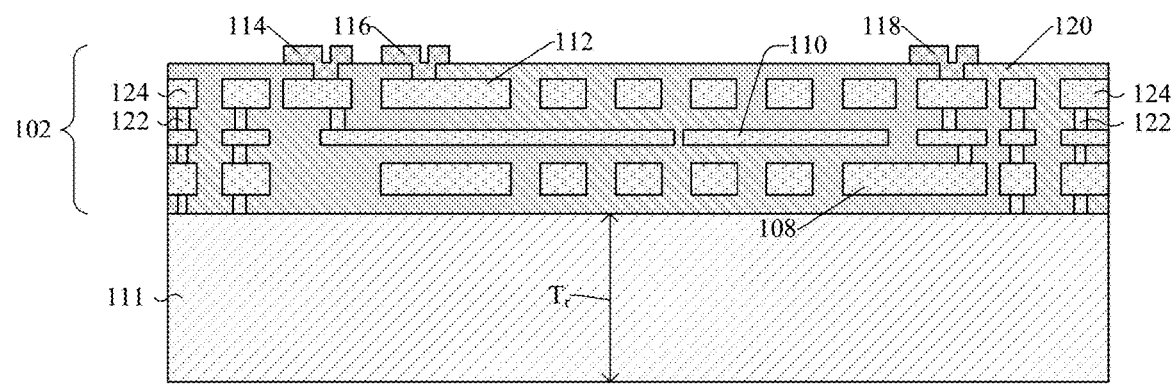
FIGS. 22-29 illustrate cross-sectional views of some embodiments of a third method of forming a MEMS microphone with a particle filter.

As shown in cross-sectional view 2200 of FIG. 22, a MEMS substrate 111 is provided and a MEMS device structure 102 is formed over the MEMS substrate 111. The MEMS device structure 102 includes conductive wires 124, conductive vias 122, electrical contacts 114, 116, 118, an inter-level dielectric (ILD) structure 120, a first back plate 108, a second back plate 112, and a diaphragm 110 disposed between the first and second back plates 108, 112. In some embodiments, the MEMS device structure 102 is formed as illustrated and/or described in FIG. 7. The MEMS substrate 111 may be, for example, a bulk substrate (e.g., a bulk silicon substrate), a silicon-on-insulator (SOI) substrate, or some other suitable substrate with an initial thickness $T_r$.

Figure 23:
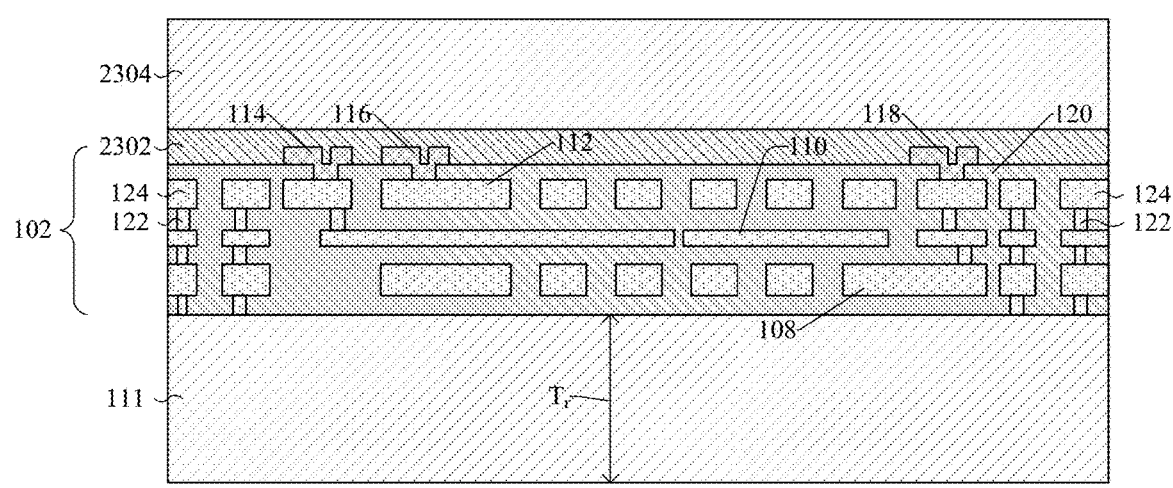

As shown in cross-sectional view 2300 of FIG. 23, an adhesive bonding layer 2302 and a sacrificial substrate 2304 are bonded to the ILD structure 120 of the MEMS device structure 102. In some embodiments, the bonding process is a fusion bonding process, or another suitable bonding process and/or may include reaching a maximum temperature within a range of 200 to 300 degrees Celsius. The sacrificial substrate 2304 is configured to increase a structural integrity of the MEMS device structure 102 and/or the MEMS substrate 111 during subsequent processing steps (e.g., the thinning process of FIG. 24 and/or the bonding process of FIG. 26).

Figure 24:
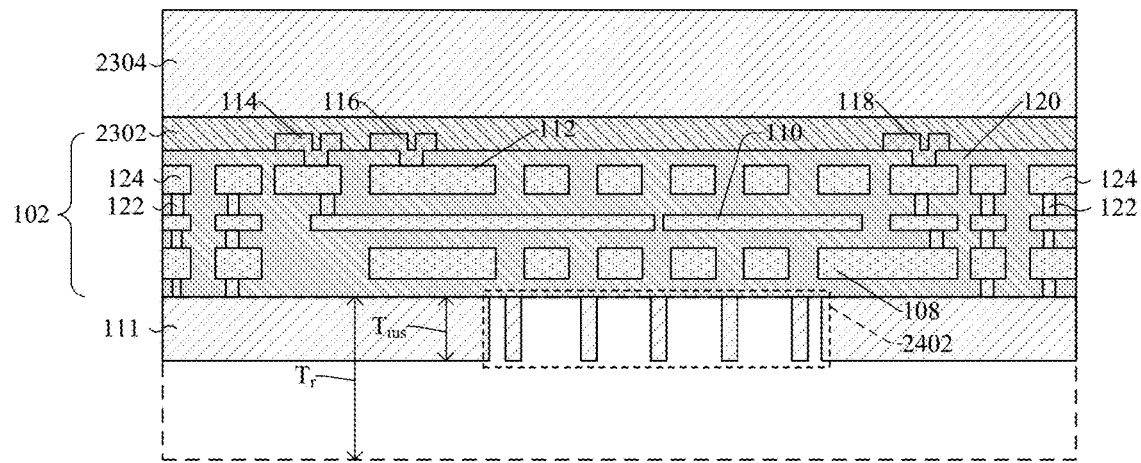

As shown in cross-sectional view 2400 of FIG. 24, a thinning process is performed on the MEMS substrate 111 to reduce the initial thickness $T_i$ of the MEMS substrate 111 to a thickness $T_{ms}$. In some embodiments, the thickness $T_{ms}$ is within a range of about 10 to 200 micrometers. In some embodiments, the thinning process is performed by a mechanical grinding process, a chemical mechanical polish (CMP), some other thinning process, or any combination of the foregoing. For example, the thinning process may be performed wholly by a mechanical grinding process. After performing the thinning process, the MEMS substrate 111 is patterned to define a plurality of pillars 2402 in the MEMS substrate 111. In some embodiments, the patterning process includes: forming a masking layer over a back surface of the MEMS substrate 111 (not shown); exposing unmasked regions of the MEMS substrate 111 to one or more etchants, thereby defining the pillars 2402; and performing a removal process to remove the masking layer. The plurality of pillars 2402 are configured to further increase a structural integrity of the MEMS substrate 111 during subsequent processing steps (e.g., the bonding process of FIG. 26).

Figure 25:
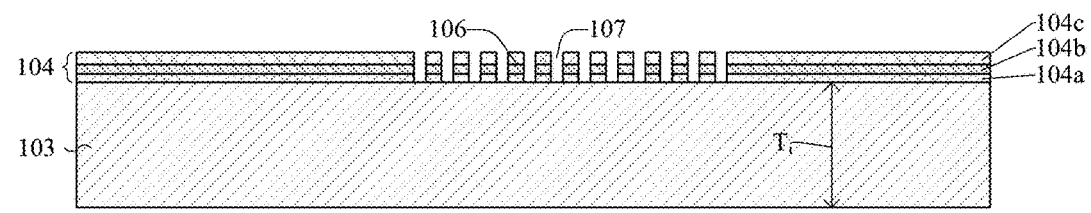

As shown in cross-sectional view 2500 of FIG. 25, a carrier substrate 103 is provided. In some embodiments, the carrier substrate 103 may be, for example, a bulk substrate (e.g., a bulk silicon substrate), a silicon-on-insulator (SOI) substrate, or some other suitable substrate and/or may have an initial thickness $T_i$ within a range of approximately 250 to 725 micrometers. A filter stack 104 is formed over the carrier substrate 103. The filter stack 104 includes a lower dielectric layer 104a, a particle filter layer 104b, and an upper dielectric layer 104c. In some embodiments, the filter stack 104 is formed as illustrated and/or described in FIG. 5.

Also shown in FIG. 25, the filter stack 104 is etched, thereby defining a plurality of filter openings 107 and a particle filter 106. In some embodiments, the etching process includes: forming a masking layer (not shown) over the upper dielectric layer 104c, exposing unmasked regions of the upper dielectric layer 104c to one or more etchants, and performing a removal process to remove the masking layer.

Figure 26:
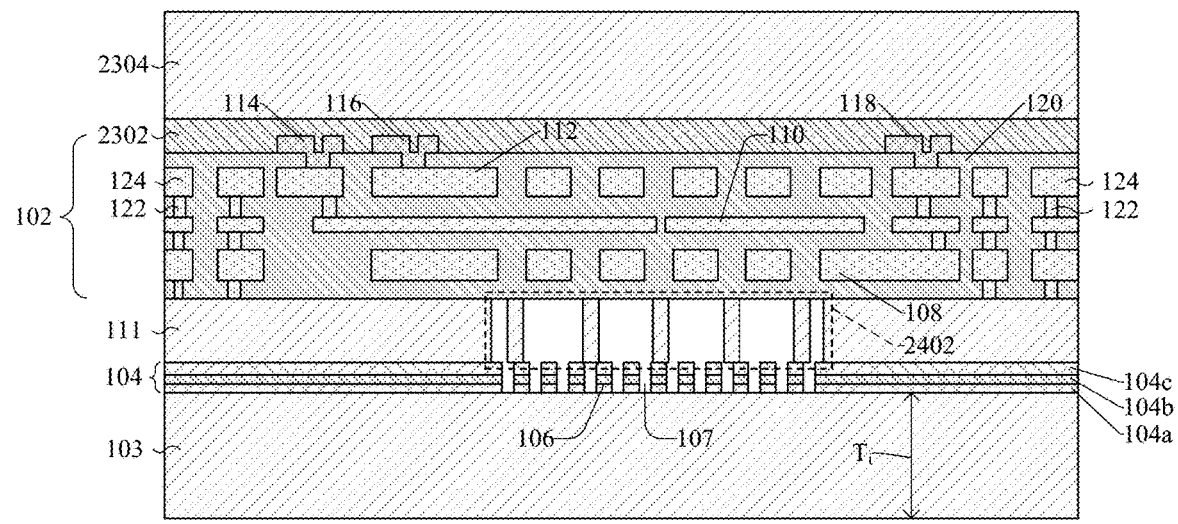

As shown in cross-sectional view 2600 of FIG. 26, The MEMS substrate 111 is bonded to the upper dielectric layer 104c. In some embodiments, the bonding process may, for example, be a fusion bonding process, or another suitable bonding process. After performing the bonding process, a thinning process is performed on the carrier substrate 103 to reduce an initial thickness $T_i$ of the carrier substrate 103 to a thickness $T_{cs}$. In some embodiments, the thickness $T_{cs}$ is within a range of about 200 to 400 micrometers. In some embodiments, the thinning process is performed by a mechanical grinding process, a chemical mechanical polish (CMP), some other thinning process, or any combination of the foregoing. For example, the thinning process may be performed wholly by a mechanical grinding process.

Figure 27:
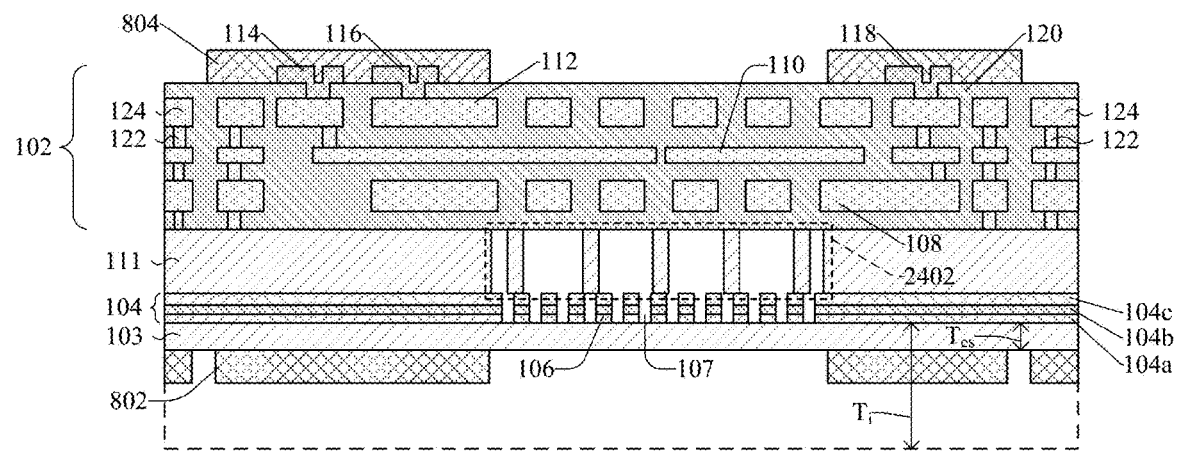

As shown in cross-sectional view 2700 of FIG. 27, the adhesive bonding layer (2302 of FIG. 26) and the sacrificial substrate (2304 of FIG. 26) are separated from the MEMS device structure 102 (de-bond from ILD structure 120). After the separation process, a lower masking layer 802 is formed on a bottom surface of the carrier substrate 103 and an upper masking layer 804 is formed over the ILD structure 120. In some embodiments, the lower masking layer 802 and/or the upper masking layer 804 may, for example, respectively be or comprise a photoresist, a hard mask layer, or the like. The lower masking layer 802 and the upper masking layer 804 respectively have a plurality of sidewalls defining a plurality of openings.

Figure 28:
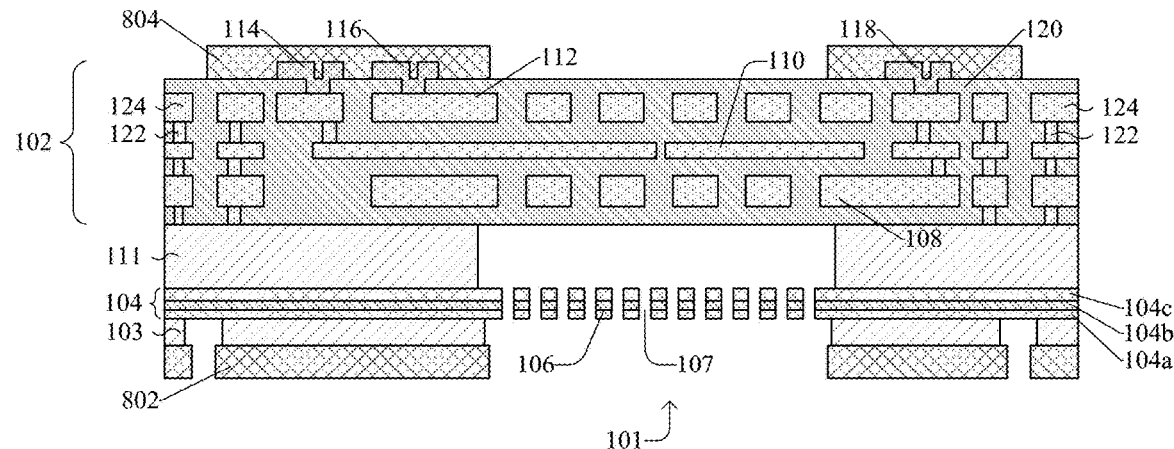

As shown in cross-sectional view 2800 of FIG. 28, a first patterning process is performed on the carrier substrate 103 according to the lower masking layer 802. In some embodiments, the first patterning process includes performing a dry etching process, such as a plasma etching process and/or a deep reactive-ion etching (DRIE) process. The first patterning process defines the carrier substrate opening 101 directly underlying the particle filter 106.

Also as shown in FIG. 28, after the first patterning process, a second patterning process is performed on the carrier substrate 103 and the MEMS substrate 111 according to the lower masking layer 802. In some embodiments, the second patterning process includes performing a wet etching process, such as an isotropic etching process and/or a dry etching process. The second patterning process may include exposing the carrier substrate 103 and/or the MEMS substrate 111 to one or more etchants, such as, for example, xenon difluoride ($XeF_2$). The second patterning process removes the plurality of pillars (2402 of FIG. 27) and may expand a width of the carrier substrate opening 101.

Figure 29:
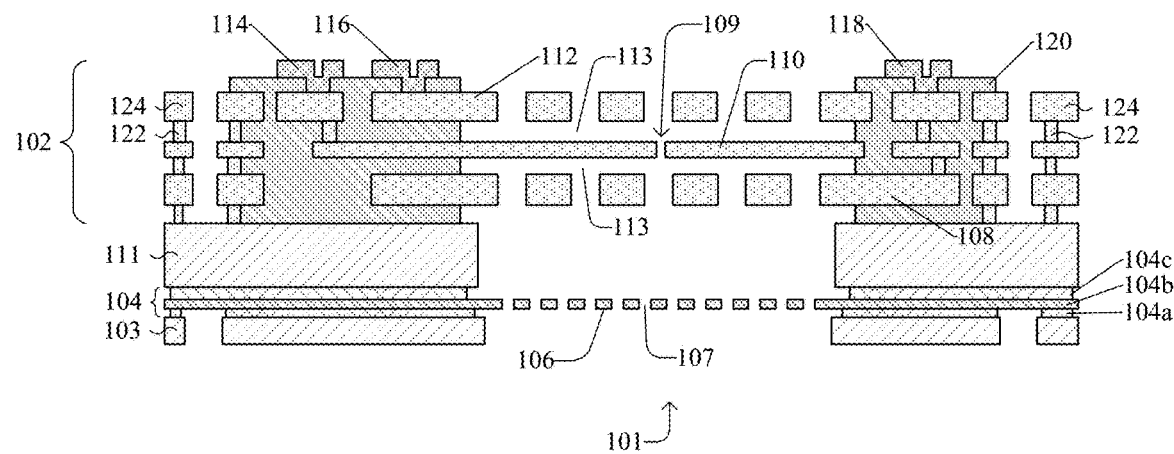

As shown in cross-sectional view 2900 of FIG. 29, a third patterning process is performed on the structure of FIG. 28. In some embodiments, the third patterning process includes performing a wet etching process and exposing the structure of FIG. 28 to one or more etchants. The third patterning removes a portion of the ILD structure 120, thereby defining the air volume space 113. Further, the fourth patterning process removes the lower dielectric layer 104a from a bottom surface of the particle filter 106 and removes the upper dielectric layer 104c from a top surface of the particle filter 106. After performing the third patterning process, a removal process is performed to remove the lower and upper masking layers (802, 804 of FIG. 28).

Figure 30:
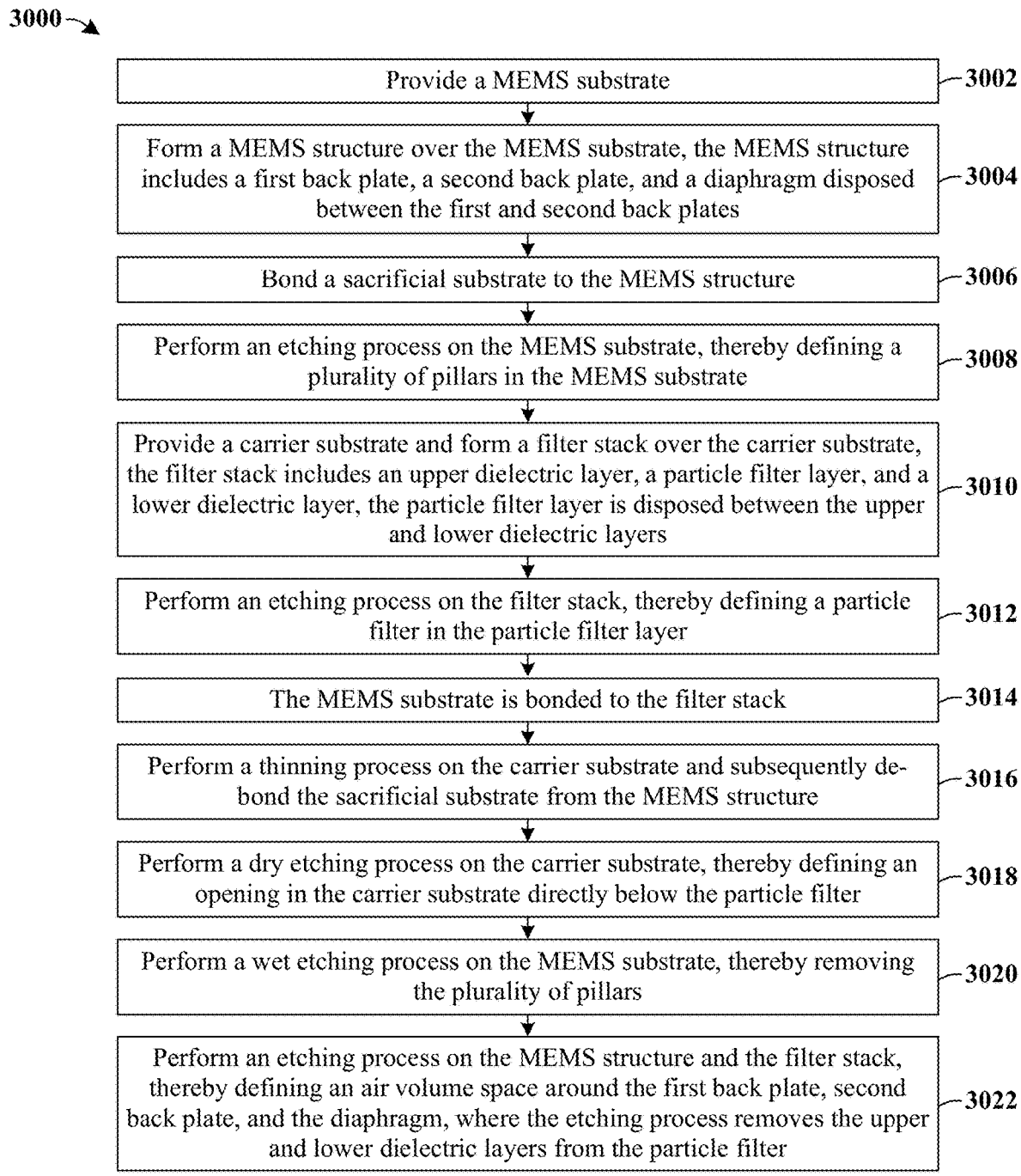
FIG. 30 illustrates a methodology in flowchart format that illustrates some embodiments of the third method of forming a MEMS microphone with a particle filter.

FIG. 30 illustrates a third method 3000 of forming a MEMS microphone with a particle filter in accordance with some embodiments. Although the third method 3000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 3002, a MEMS substrate is provided. FIG. 22 illustrates a cross-sectional view 2200 corresponding to some embodiments of act 3002.

At act 3004, a MEMS structure is formed over the MEMS substrate. The MEMS structure includes a first back plate, a second back plate, and a diaphragm disposed between the first and second back plates. FIG. 22 illustrates a cross-sectional view 2200 corresponding to some embodiments of act 3004.

At act 3006, a sacrificial substrate is bonded to the MEMS structure. FIG. 23 illustrates a cross-sectional view 2300 corresponding to some embodiments of act 3006.

At act 3008, an etching process is performed on the MEMS substrate, thereby defining a plurality of pillars in the MEMS substrate. FIG. 24 illustrates a cross-sectional view 2400 corresponding to some embodiments of act 3008.

At act 3010, a carrier substrate is provided and a filter stack is formed over the carrier substrate. The filter stack includes an upper dielectric layer, a particle filter layer, and a lower dielectric layer, the particle filter layer is disposed between the upper and lower dielectric layers. FIG. 25 illustrates a cross-sectional view 2500 corresponding to some embodiments of act 3010.

At act 3012, an etching process is performed on the filter stack, thereby defining a particle filter in the particle filter layer. FIG. 25 illustrates a cross-sectional view 2500 corresponding to some embodiments of act 3012.

At act 3014, the MEMS substrate is bonded to the filter stack. FIG. 26 illustrates a cross-sectional view 2600 corresponding to some embodiments of act 3014.

At act 3016, a thinning process is performed on the carrier substrate. After the thinning process, the sacrificial substrate is de-bonded from the MEMS structure. FIG. 27 illustrates a cross-sectional view 2700 corresponding to some embodiments of act 3016.

At act 3018, a dry etching process is performed on the carrier substrate, thereby defining an opening in the carrier substrate directly below the particle filter. FIG. 28 illustrates a cross-sectional view 2800 corresponding to some embodiments of act 3018.

At act 3020, a wet etching process is performed on the MEMS substrate, thereby removing the plurality of pillars. FIG. 28 illustrates a cross-sectional view 2800 corresponding to some embodiments of act 3020.

At act 3022, an etching process is performed on the MEMS substrate and the filter stack, thereby defining an air volume space around the first back plate, second back plate, and the diaphragm. The etching process removes the upper and lower dielectric layers from the particle filter. FIG. 29 illustrates a cross-sectional view 2900 corresponding to some embodiments of act 3022.

Accordingly, in some embodiments, the present disclosure relates to multiple methods that simplify the fabrication of a MEMS device with a particle filter, such that the particle filter is disposed between a MEMS substrate and a carrier substrate.

In some embodiments, the present application provides a microphone including a microelectromechanical systems (MEMS) device structure overlying a MEMS substrate, wherein the MEMS device structure includes a diaphragm having opposing sidewalls that define a diaphragm opening; a carrier substrate underlying the MEMS substrate, wherein the carrier substrate has opposing sidewalls that define a carrier substrate opening underlying the diaphragm opening; and a filter stack sandwiched between the carrier substrate and the MEMS substrate, the filter stack includes an upper dielectric layer, a lower dielectric layer, and a particle filter layer disposed between the upper and lower dielectric layers, wherein the particle filter layer includes a particle filter spaced laterally between the opposing sidewalls of the carrier substrate.

In some embodiments, the present application provides a microelectromechanical systems (MEMS) device, including a MEMS substrate having opposing sidewalls that define a MEMS opening; a MEMS structure vertically over the MEMS substrate, wherein the MEMS structure includes a first back plate and a diaphragm vertically separated from the first back plate; a carrier substrate underlying the MEMS substrate, wherein the carrier substrate has opposing sidewalls defining a carrier substrate opening, wherein the carrier substrate opening underlies the diaphragm and the MEMS opening; and a filter stack disposed between the carrier substrate and the MEMS substrate, wherein the filter stack includes a particle filter layer having a particle filter, wherein the particle filter includes a plurality of filter openings that extends through the particle filter layer and is laterally between the opposing sidewalls of the MEMS substrate.

In some embodiments, the present application provides a method for manufacturing a microelectromechanical systems (MEMS) device, the method includes forming a filter stack over a carrier substrate, wherein the filter stack includes an upper dielectric layer, a lower dielectric layer, and a particle filter layer disposed between the upper and lower dielectric layers; patterning the filter stack to define a particle filter in the particle filter layer, the particle filter having one or more surfaces continuously extending around a plurality of filter openings; bonding a MEMS substrate to the upper dielectric layer; forming a MEMS structure over the MEMS substrate, the MEMS structure includes a mobile diaphragm; patterning the carrier substrate to define a carrier substrate opening in the carrier substrate; patterning the MEMS substrate to define a MEMS opening in the MEMS substrate; and performing an etch process on the MEMS structure and the filter stack, wherein the etch process removes the upper and lower dielectric layers from directly above and directly below the particle filter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microphone comprising:
a microelectromechanical systems (MEMS) device structure overlying a MEMS substrate, wherein the MEMS device structure includes a diaphragm having opposing sidewalls that define a diaphragm opening;
a carrier substrate underlying the MEMS substrate, wherein the carrier substrate has opposing sidewalls that define a carrier substrate opening underlying the diaphragm opening; and
a filter stack sandwiched between the carrier substrate and the MEMS substrate, the filter stack includes an upper dielectric layer, a lower dielectric layer, and a particle filter layer disposed between the upper and lower dielectric layers, wherein the particle filter layer comprises a particle filter spaced laterally between the opposing sidewalls of the carrier substrate, and wherein the particle filter layer includes an upper filter layer, a lower filter layer, and a middle filter layer disposed between the upper and lower filter layers, wherein the upper and lower filter layers comprise a first material, and wherein the middle filter layer comprises a second material different from the first material.

2. The microphone of claim 1, wherein the particle filter has a plurality of opposing sidewalls that define a plurality of filter openings, wherein the plurality of filter openings are laterally between the opposing sidewalls of the carrier substrate, and wherein the particle filter layer includes a polysilicon layer sandwiched between an upper silicon nitride layer and a lower silicon nitride layer.

3. The microphone of claim 2, wherein the particle filter layer comprises silicon nitride, and wherein the upper and lower dielectric layers each comprise an oxide.

4. The microphone of claim 2, wherein the first material comprises silicon nitride and the second material comprises polysilicon.

5. The microphone of claim 2, wherein a thickness of the particle filter layer is less than a thickness of the upper dielectric layer and less than a thickness of the lower dielectric layer.

6. The microphone of claim 1, wherein a thickness of the MEMS substrate is less than a thickness of the carrier substrate.

7. A microelectromechanical systems (MEMS) device, comprising:
   a MEMS substrate having opposing sidewalls that define a MEMS opening;
   a MEMS structure vertically over the MEMS substrate, wherein the MEMS structure includes a first back plate and a diaphragm vertically separated from the first back plate;
   a carrier substrate underlying the MEMS substrate, wherein the carrier substrate has opposing sidewalls defining a carrier substrate opening, wherein the carrier substrate opening underlies the diaphragm and the MEMS opening; and
   a filter stack disposed between the carrier substrate and the MEMS substrate, wherein the filter stack includes a particle filter layer having a particle filter, wherein the particle filter comprises a plurality of filter openings that extends through the particle filter layer and is laterally between the opposing sidewalls of the MEMS substrate, wherein the particle filter layer includes a polysilicon layer, a first nitride layer, and a second nitride layer, wherein the plurality of filter openings of the particle filter are defined by sidewalls of the first nitride layer, sidewalls of the second nitride layer, and sidewalls of the polysilicon layer disposed between the first and second nitride layers.

8. The MEMS device of claim 7, wherein the filter stack further includes:
   an upper dielectric layer disposed between the MEMS substrate and the particle filter layer;
   a lower dielectric layer disposed between the carrier substrate and the particle filter layer; and
   wherein outer sidewalls of the particle filter layer extend past outer sidewalls of the upper dielectric layer and outer sidewalls of the lower dielectric layer.

9. The MEMS device of claim 8, wherein the outer sidewalls of the upper dielectric layer and the outer sidewalls of the lower dielectric layer are respectively laterally offset from the outer sidewalls of the particle filter layer by a non-zero distance in a direction towards the plurality of filter openings.

10. The MEMS device of claim 8, wherein the upper and lower dielectric layers each comprise an oxide.

11. The MEMS device of claim 7, wherein a thickness of the particle filter layer is less than a thickness of the MEMS substrate, wherein a thickness of the MEMS substrate is less than a thickness of the carrier substrate.

12. The MEMS device of claim 7, wherein the carrier substrate comprises sidewalls defining a carrier substrate opening beneath the particle filter.

13. The MEMS device of claim 7, wherein the plurality of filter openings are circular or elliptical when viewed from above.

14. A method for manufacturing a microelectromechanical systems (MEMS) device, the method comprising:
   forming a filter stack over a carrier substrate, wherein the filter stack includes an upper dielectric layer, a lower dielectric layer, and a particle filter layer disposed between the upper and lower dielectric layers;
   patterning the filter stack while the filter stack is disposed on the carrier substrate to define a particle filter in the particle filter layer, wherein the particle filter has one or more surfaces continuously extending around a plurality of filter openings;
   bonding a MEMS substrate to the upper dielectric layer;
   forming a MEMS structure over the MEMS substrate, the MEMS structure includes a mobile diaphragm;
   patterning the carrier substrate to define a carrier substrate opening in the carrier substrate;
   patterning the MEMS substrate to define a MEMS opening in the MEMS substrate; and
   performing an etch process on the MEMS structure and the filter stack, wherein the etch process removes the upper and lower dielectric layers from directly above and directly below the particle filter.

15. The method according to claim 14, wherein the filter stack is patterned before bonding the MEMS substrate to the upper dielectric layer.

16. The method according to claim 14, wherein the filter stack is patterned after defining the carrier substrate opening and before defining the MEMS opening in the MEMS substrate.

17. The method according to claim 14, wherein the MEMS structure is formed over the MEMS substrate before bonding the MEMS substrate to the upper dielectric layer.

18. The method according to claim 14, wherein the MEMS structure further comprises a first back plate and a second back plate, and wherein the particle filter layer includes an upper filter layer, a lower filter layer, and a middle filter layer disposed between the upper and lower filter layers, wherein the upper and lower filter layers comprise silicon nitride, and wherein the middle filter layer comprises polysilicon.

19. The method according to claim 14, wherein patterning the filter stack includes removing segments of the upper dielectric layer, segments of the lower dielectric layer, and segments of the particle filter layer.

20. The method according to claim 14, further comprising:
   performing a dry etching process on the MEMS substrate to define pillars in the MEMS substrate before patterning the MEMS substrate.

* * * * *